United States Patent
Maeda et al.

(10) Patent No.: US 8,809,990 B2
(45) Date of Patent: Aug. 19, 2014

(54) SEMICONDUCTOR DEVICE AND METHOD OF MANUFACTURING THE SAME

(75) Inventors: Shigenobu Maeda, Seongnam-si (KR);
Hyun-pil Noh, Seongnam-si (KR);
Choong-ho Lee, Yongin-si (KR);
Seog-heon Ham, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/611,759

(22) Filed: Sep. 12, 2012

(65) Prior Publication Data

US 2013/0134520 A1    May 30, 2013

(30) Foreign Application Priority Data

Nov. 25, 2011  (KR) .................. 10-2011-0124393

(51) Int. Cl.
*H01L 21/70*    (2006.01)
*H01L 29/66*    (2006.01)

(52) U.S. Cl.
USPC ........... 257/500; 257/213; 257/337; 257/343; 257/501; 257/E27.064

(58) Field of Classification Search
USPC ........... 257/69, 162, 202, 204, 206, 335, 336, 257/337, 338, 339, 343, 344, 351, 355, 356, 257/357, 410, 411, 499, 500, 501, 506, 257/E27.001, E27.014, E27.059, E27.06, 257/E27.062, E27.064, 213
See application file for complete search history.

(56) References Cited

U.S. PATENT DOCUMENTS

| | | | |
|---|---|---|---|
| 5,124,272 A * | 6/1992 | Saito et al. | ........ 438/297 |
| 7,180,134 B2 | 2/2007 | Yang et al. | |
| 7,371,644 B2 | 5/2008 | Yagishita et al. | |
| 7,566,619 B2 | 7/2009 | Ahn et al. | |
| 7,932,564 B2 | 4/2011 | Goto et al. | |
| 2004/0126944 A1* | 7/2004 | Pacheco Rotondaro et al. | ........ 438/197 |
| 2009/0090976 A1* | 4/2009 | Kavalieros et al. | ........ 257/369 |
| 2009/0280632 A1* | 11/2009 | Lin et al. | ........ 438/588 |
| 2010/0207204 A1* | 8/2010 | Kim et al. | ........ 257/330 |
| 2010/0270621 A1* | 10/2010 | Iwamoto et al. | ........ 257/368 |
| 2012/0292708 A1* | 11/2012 | Chen et al. | ........ 257/368 |

FOREIGN PATENT DOCUMENTS

JP    2009-164638    7/2009

OTHER PUBLICATIONS

Sze Semiconductor Devices Physics and Technology, 2nd Edition, p. 186.*

* cited by examiner

*Primary Examiner* — Cuong Q Nguyen
*Assistant Examiner* — Galina Yushina
(74) *Attorney, Agent, or Firm* — Onello & Mello, LLP

(57) ABSTRACT

Provided are a semiconductor device including a high voltage transistor and a low voltage transistor and a method of manufacturing the same. The semiconductor device includes a semiconductor substrate including a high voltage region and a low voltage region; a high voltage transistor formed in the high voltage region and including a first active region, a first source/drain region, a first gate insulating layer, and a first gate electrode; and a low voltage transistor formed in the low voltage region and including a second active region, a second source/drain region, a second gate insulating layer, and a second gate electrode. The second source/drain region has a smaller thickness than a thickness of the first source/drain region.

15 Claims, 29 Drawing Sheets

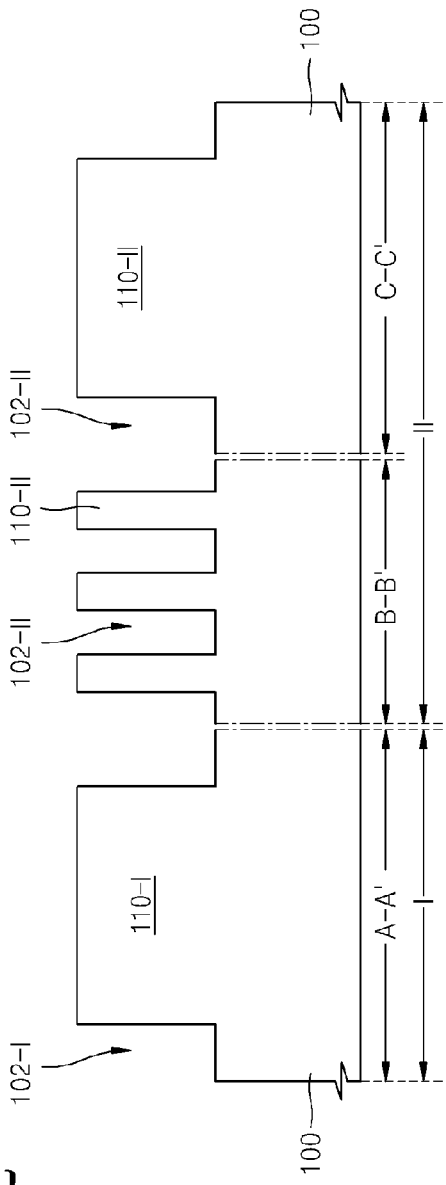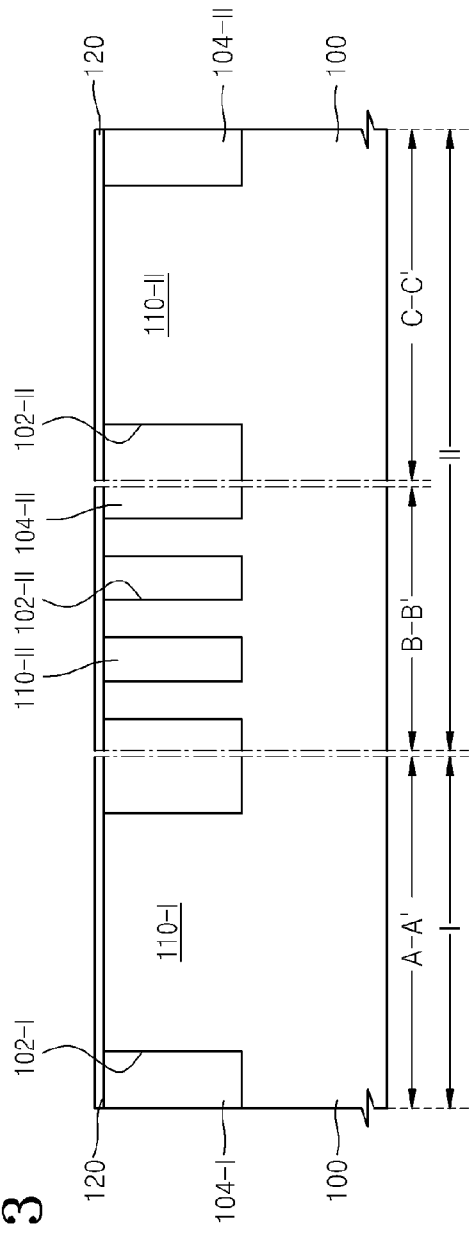

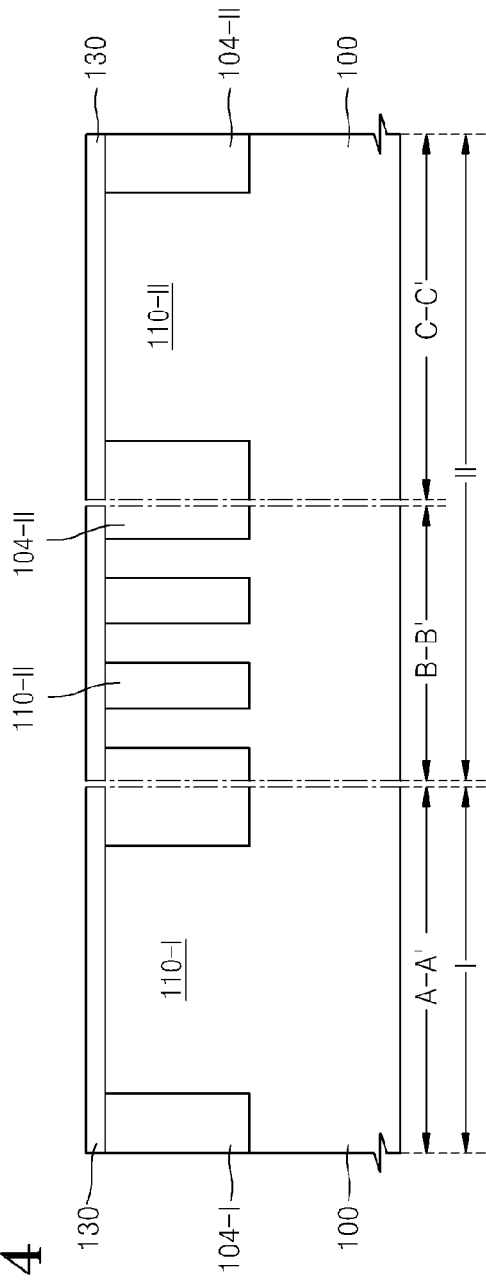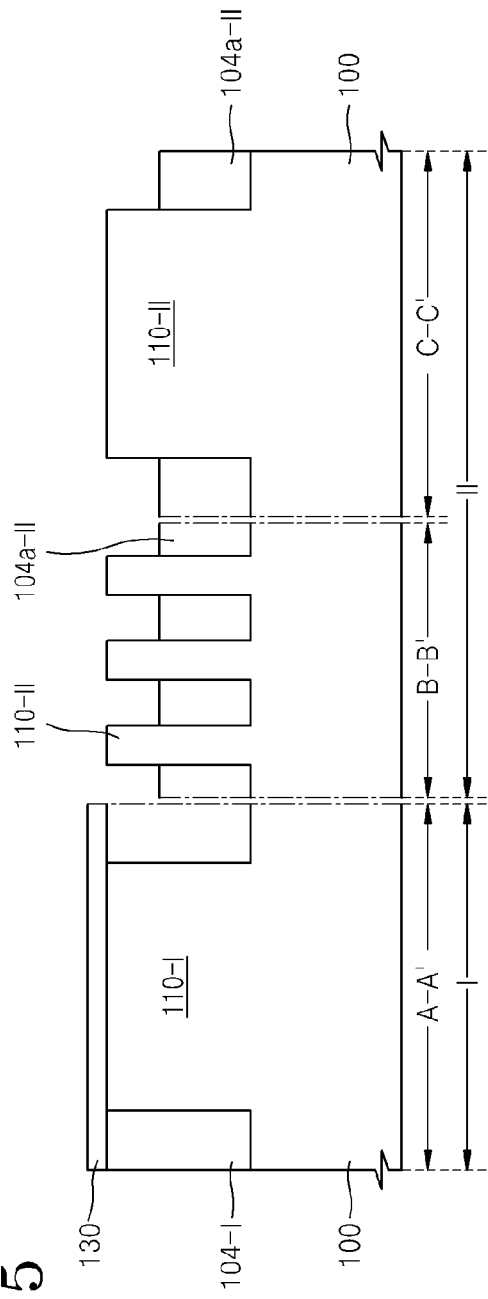

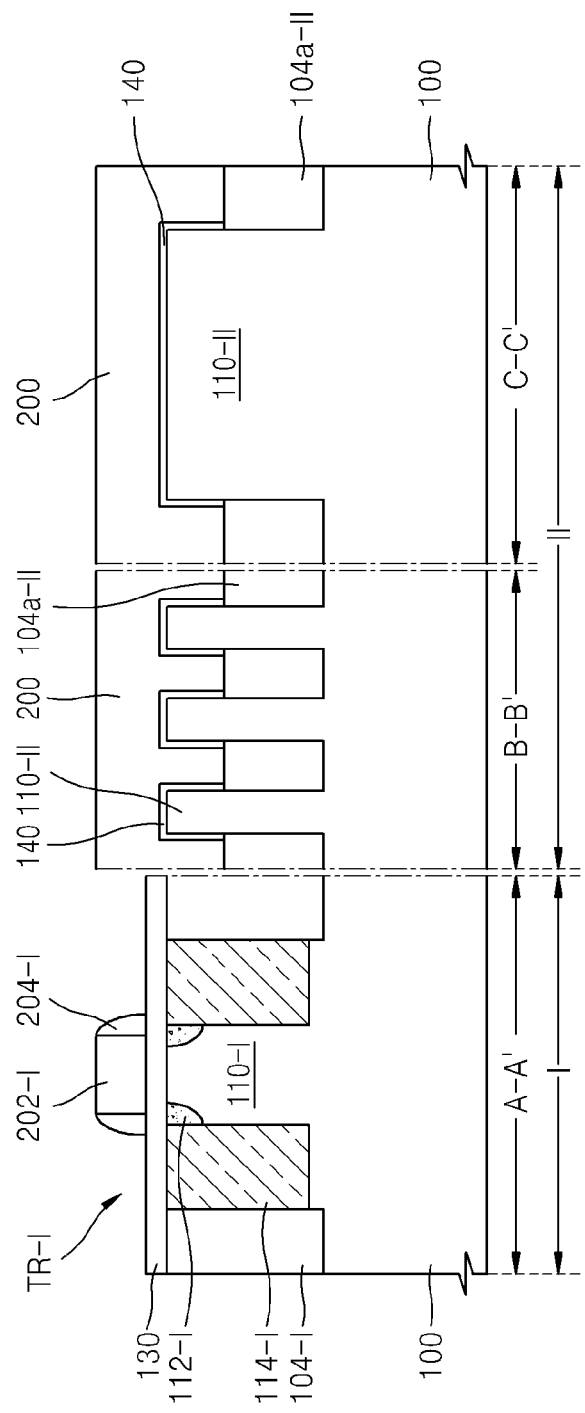

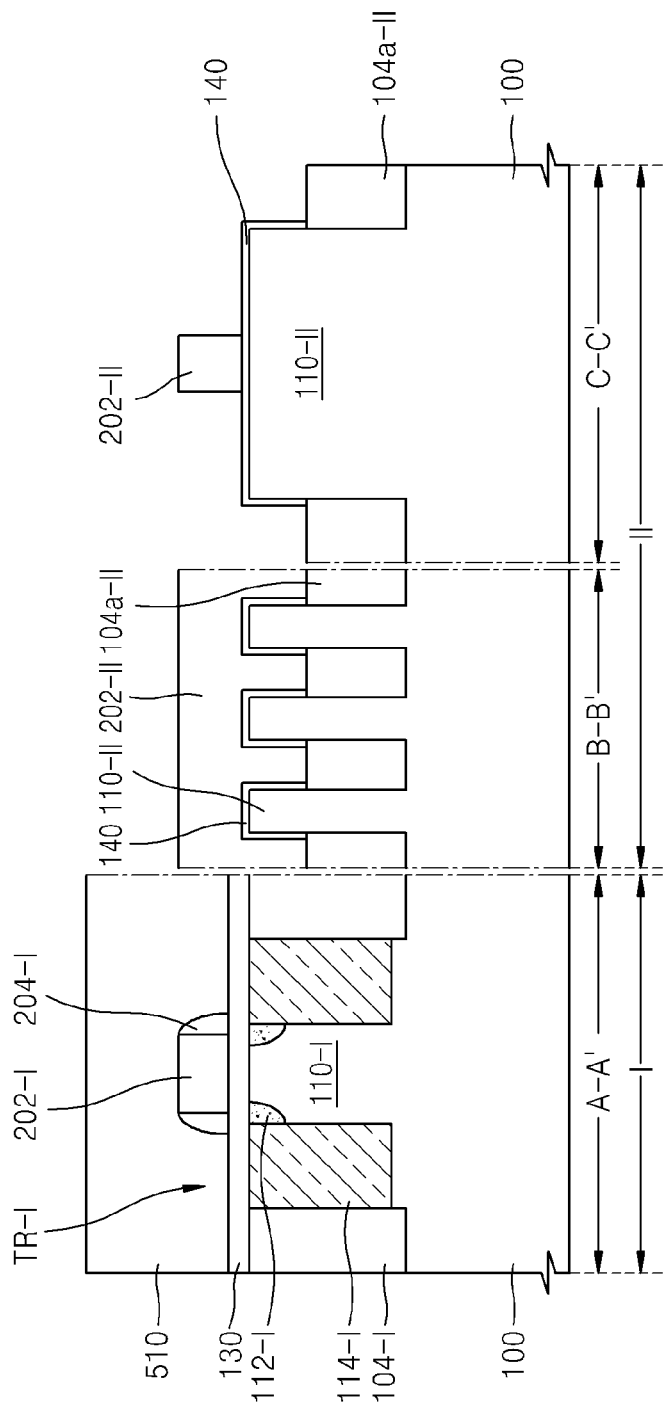

SEMICONDUCTOR DEVICE AND METHOD OF MANUFACTURING THE SAME

CROSS-REFERENCE TO RELATED APPLICATIONS

This application claims the benefit of Korean Patent Application No. 10-2011-0124393, filed on Nov. 25, 2011, in the Korean Intellectual Property Office, the disclosure of which is incorporated herein in its entirety by reference.

FIELD OF INVENTION

The inventive concept relates to a semiconductor device and a method of manufacturing the same, and more particularly, to a semiconductor device including a high voltage transistor and a low voltage transistor, and a method of manufacturing the same.

BACKGROUND

As the semiconductor industry has developed and users' needs increase, electronic devices are more multi-functional, and functions of semiconductor devices that are core parts of electronic devices are increasingly diverse. However, in order for one semiconductor device to have various functions, transistors of various generations having different characteristics have to be implemented along with various functions of the semiconductor device. However, different process conditions are required for manufacturing transistors of various generations. Thus, there are many difficulties in satisfying all required characteristics of multi-functional semiconductor devices.

SUMMARY

In accordance with aspect of the inventive concept, there are provided a semiconductor device including a high voltage transistor and a low voltage transistor and a method of manufacturing the same.

According to an aspect of the inventive concept, there is provided a semiconductor device including: a semiconductor substrate including a high voltage region and a low voltage region; a high voltage transistor formed in the high voltage region and including a first active region, a first source/drain region, a first gate insulating layer, and a first gate electrode; and a low voltage transistor formed in the low voltage region and including a second active region, a second source/drain region, a second gate insulating layer, and a second gate electrode. The second source/drain region has a smaller thickness than a thickness of the first source/drain region.

In various embodiments, a bottom surface of the second source/drain region may be at a higher level than a bottom surface of the first source/drain region.

In various embodiments, the first gate insulating layer may be thicker than the second gate insulating layer.

In various embodiments, the second gate insulating layer may include material having a higher dielectric constant than a dielectric constant of the first gate insulating layer.

In various embodiments, the first gate insulating layer may include silicon oxide or silicon oxy-nitride, and the second gate insulating layer may have a high dielectric constant than the first gate insulating layer and may include metal oxide or metal silicate.

In various embodiments, the semiconductor device may further include an interfacial oxide layer disposed between the second gate insulating layer and the second active region.

In various embodiments, the second gate electrode may include material having a lower resistivity than resistivity of the first gate electrode.

In various embodiments, the second gate electrode may include metal or conductive metal nitride.

In various embodiments, the semiconductor device may further include a pair of second spacer layers disposed at both sides of the second gate electrode, wherein the second gate insulating layer extends from a space between the second gate electrode and the second active region to a space between the second gate electrode and the second spacer layer.

In various embodiments, the semiconductor device may further include a first isolation layer and a second isolation layer that define the first active region and the second active region, respectively, wherein a bottom surface of the first isolation layer and a bottom surface of the second isolation layer are at the same level.

In various embodiments, a top surface of the first isolation layer may be at a higher level than a top surface of the second isolation layer.

In various embodiments, the low voltage transistor may include a Fin field effect transistor (FinFET) in which a channel region is formed on a top surface and both sides of the second active region.

In various embodiments, a width of the first active region in a direction in which the first gate electrode extends, may be greater than a width of the second active region in a direction in which the second gate electrode extends.

In various embodiments, the second source/drain region may have a greater change in doping concentration than a change in doping concentration of the first source/drain region, according to a depth.

According to another aspect of the inventive concept, there is provided a semiconductor device including: a semiconductor substrate including a first region and a second region; a high voltage transistor formed in the first region and including a first active region, a first source/drain region, a first gate insulating layer, and a first gate electrode; and a low voltage transistor formed in the second region and including a second active region, a second source/drain region, a second gate insulating layer, and a second gate electrode. The second source/drain region has a smaller thickness than a thickness of the first source/drain region, and a top surface of the first gate electrode and a top surface of the second gate electrode are at the same level.

According to another aspect of the inventive concept, there is provided a semiconductor device comprising: a semiconductor substrate comprising a high voltage region and a low voltage region; a high voltage transistor formed in the high voltage region; and a low voltage transistor formed in the low voltage region. The high voltage transistor has a first source/drain region that is thicker than a second source/drain region of the low voltage transistor.

In various embodiments, the high voltage transistor may include a first active region that comprises the first source/drain region, a first gate insulating layer, and a first gate electrode; and the low voltage transistor may include a second active region that comprises the second source/drain region, a second gate insulating layer, and a second gate electrode.

In various embodiments, a top surface of the first gate electrode and a top surface of the second gate electrode may be at the same level.

In various embodiments, the first gate insulating layer may be thicker than the second gate insulating layer.

In various embodiments, a width of the first active region in a direction in which the first gate electrode extends may be greater than a width of the second active region in a direction in which the second gate electrode extends.

According to another aspect of the inventive concept, there is provided a method of manufacturing a semiconductor device. The method includes: preparing a semiconductor substrate including a high voltage region and a low voltage region in which a first active region and a second active region are defined by a first isolation layer and a second isolation layer, respectively; forming a first gate insulating layer on the first active region and on the second active region; forming a first source/drain region in the first active region; and after the first source/drain region is formed, forming a second source/drain region having a smaller thickness than a thickness of the first source/drain region in the second active region.

In various embodiments, the preparing of the semiconductor substrate may include: forming the first isolation layer in the high voltage region and the low voltage region to expose a top surface of the first active region and a top surface of the second active region; and forming the second isolation layer to expose a portion of sides of the second active region by removing a portion of the first isolation layer formed in the low voltage region.

In various embodiments, the forming of the second isolation layer may include removing a portion of the first isolation layer formed in the low voltage region along with the first gate insulating layer formed on the second active region.

In various embodiments, the method may further include, before the forming of the first source/drain region, etching the first gate material layer to form a first gate material layer on the high voltage region and on the low voltage region; and forming a first gate electrode that crosses the first active region and extends from the first active region.

In various embodiments, the method may further include, after the forming of the first source/drain region and before the forming of the second source/drain region, etching the first gate material layer to form a second gate electrode that crosses the second active region on the low voltage region and extends from the second active region, by.

In various embodiments, the method may further include, after the forming of the first source/drain region and before the forming of the second source/drain region, the method may further include etching the first gate material layer to form a dummy gate electrode that crosses the second active region on the low voltage region and extends from the second active region.

In various embodiments, the method may further include forming an interlayer insulating layer covering the semiconductor substrate to expose a top surface of the first gate electrode and a top surface of the dummy gate electrode; forming a recess in a space formed by removing the dummy gate electrode; forming a second gate electrode by filling metal or conductive metal nitride into the recess.

In various embodiments, before the forming of the first gate material layer, the method may further include forming a buffer oxide layer for covering the second active region exposed by the second isolation layer, and after the forming of the recess removing a portion of the buffer oxide layer exposed in the recess.

In various embodiments, after the removing of the portion of the buffer oxide layer exposed in the recess, the method may further include forming an interfacial oxide layer on the second active region that is exposed by removing the portion of the buffer oxide layer.

In various embodiments, after the forming of the recess and before the forming of the second gate electrode, the method may further include forming a second gate insulating layer for filling a portion of the recess.

In various embodiments, after the forming of the dummy gate electrode and before the forming of the interlayer insulating layer, the method may further include forming a second spacer layer covering both sides of the dummy gate electrode, wherein the second gate insulating layer extends from a space between the second active region and the second gate electrode to a space between the gate electrode and the second spacer layer within the recess.

In various embodiments, the second gate insulating layer may have a higher dielectric constant than a dielectric constant of the first gate insulating layer and may have a smaller thickness than a thickness of the first gate insulating layer.

According to another aspect of the inventive concept, there is provided a method of manufacturing a semiconductor device. The method includes: preparing a semiconductor substrate including a first region in which a high voltage transistor is to be formed and a second region in which a low voltage transistor is to be formed, wherein a first active region of the first region and a second active region of the second region are defined by a first isolation layer and a second isolation layer, respectively; forming a first gate insulating layer of the high voltage transistor and a first gate electrode of the high voltage transistor that crosses the first active region and extends from the first active region, on the first active region; forming a first source/drain region of the high voltage transistor in the first active region; and after the first source/drain region is formed, forming a second source/drain region of the low voltage transistor in the second active region. The forming of the first source/drain region and the forming of the second source/drain region include first thermal processing and second thermal processing, respectively, and the second thermal processing is performed for a shorter time than a time for performing the first thermal processing.

In various embodiments, after the second source/drain region is formed, the method may further include forming a second gate insulating layer of the low voltage transistor and a second gate electrode of the low voltage transistor that crosses the second active region and extends from the second active region, on the second active region.

In various embodiments, after the second thermal processing is performed, the second source/drain region may have a smaller thickness than a thickness of the first source/drain region.

According to another aspect of the inventive concept, there is provided a method of making a semiconductor device, comprising: providing a semiconductor substrate comprising a high voltage region and a low voltage region; fanning a high voltage transistor in the high voltage region; and forming a low voltage transistor in the low voltage region. The high voltage transistor has a first source/drain region that is thicker than a second source/drain region of the low voltage transistor.

In various embodiments, forming the high voltage transistor may include forming a first active region that comprises the first source/drain region, a first gate insulating layer, and a first gate electrode; and forming the low voltage transistor may include forming a second active region that comprises the second source/drain region, a second gate insulating layer, and a second gate electrode.

In various embodiments, the method may further comprise forming a top surface of the first gate electrode and a top surface of the second gate electrode so they are at the same level.

In various embodiments, the method may further comprise forming the first gate insulating layer to be thicker than the second gate insulating layer.

In various embodiments, a width of the first active region in a direction in which the first gate electrode extends may be greater than a width of the second active region in a direction in which the second gate electrode extends.

BRIEF DESCRIPTION OF THE DRAWINGS

Various aspects of the inventive concept will be more clearly understood from the following detailed description of exemplary embodiments, when taken in conjunction with the accompanying drawings in which:

FIGS. 2 through 13B are cross-sectional views illustrating a semiconductor device useful for explaining an exemplary embodiment of a method of manufacturing a semiconductor device, according to an aspect of the inventive concept;

DETAILED DESCRIPTION OF THE EMBODIMENTS

Figure 1:
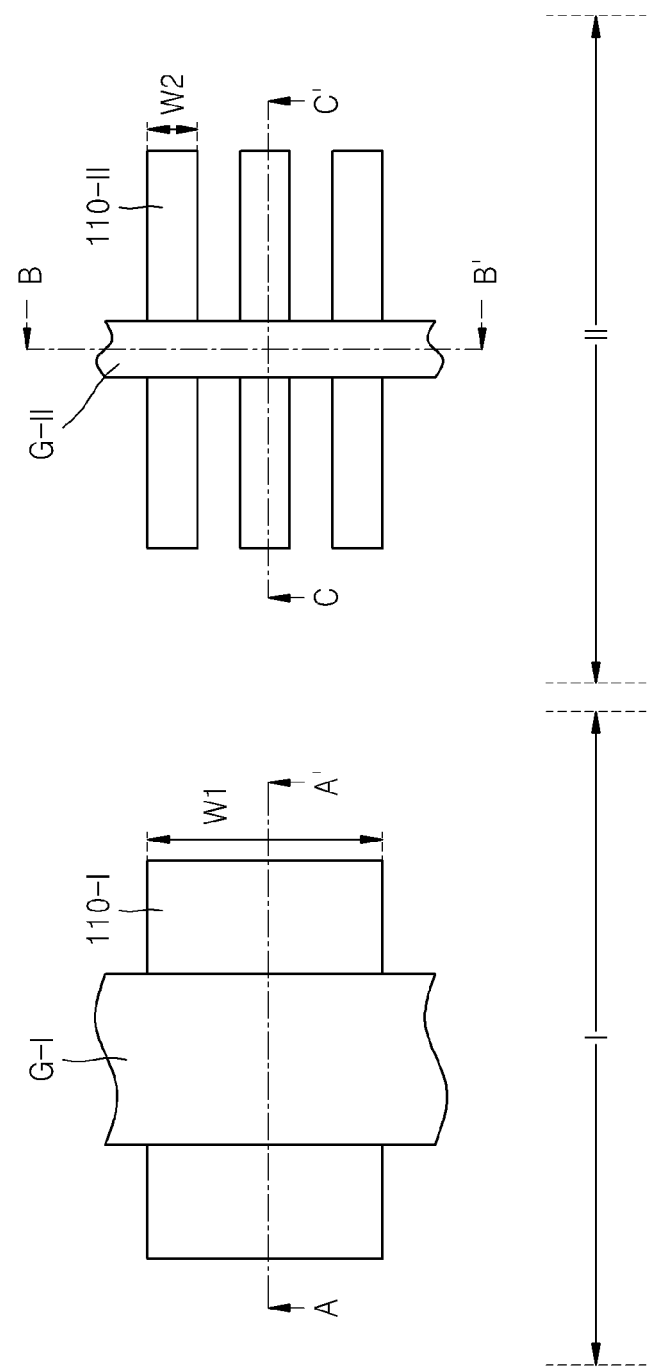
FIG. 1 illustrates an exemplary embodiment of a layout of the arrangement of a gate electrode and an active region of a semiconductor device, according to an aspect of the inventive concept.

Various exemplary embodiments will be described more fully hereinafter with reference to the accompanying drawings, in which some exemplary embodiments are shown. The inventive concept may, however, be embodied in many different fauns and should not be construed as being limited to the embodiments set forth herein. In the drawings, elements, regions, layers, and the like may be enlarged compared to their actual sizes for convenience of explanation, and ratios of the elements may similarly be exaggerated or reduced.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. This applies to interpretation of other expressions for describing the relationship between elements, i.e., "between ~" and "directly between ~", or "adjacent to ~" and "directly adjacent to ~".

It will be understood that, although the terms first, second, third etc. may be used herein to describe various elements, components, regions, layers and/or sections, these elements, components, regions, layers and/or sections should not be limited by these terms. These terms may refer to a particular order, rank, or superiority and are only used to distinguish one element, component, region, layer or section from another element, component, region, layer or section, as should be evident by the context in which they are used. Thus, a first element, component, region, layer or section discussed below could be termed a second element, component, region, layer or section without departing from the teachings of the example embodiment. For example, a first element may be referred to as a second element, and similarly, a second element may be referred to as a first element without departing from the scope of protection of the inventive concept.

As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Exemplary embodiments in accordance with the inventive concept will be described more fully with reference to the accompanying drawings, which include cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

FIG. 1 illustrates an exemplary embodiment of a layout of the arrangement of a gate electrode and an active region of a semiconductor device, according to aspects of the inventive concept.

Referring to FIG. 1, a first active region 110-I and a first gate electrode G-I may be formed in a first region I. The first gate electrode G-I may cross the first active region 110-I and may extend beyond the first active region 110-I, as shown. Also, a second active region 110-II and a second gate electrode G-II may be formed in a second region II. The second gate electrode G-II may cross the second active region 110-II and may extend beyond the second active region 110-II, as shown.

The first active region 110-I may have a first width W1, which is a width of the first active region 110-I that the first gate electrode G-I crosses, and is in a direction in which the first gate electrode G-I extends. The second active region 110-II may have a second width W2, which is a width of the second active region 110-II that the second gate electrode G-II crosses, and is in a direction in which the second gate electrode G-II extends. The first width W1 may be greater than the second width W2, as is shown.

In this embodiment, a single first active region 110-I is formed in the first region I, and three second active regions 110-II are formed in the second region II. However, aspects of the inventive concept are not limited thereto. Four or more second active regions 110-II may be formed in the direction in which the second gate electrode G-II extends, in the second active region II. Likewise, a plurality of first active regions 110-I may be formed in the direction in which the first gate electrode G-I extends. In addition, although one first gate electrode G-I and one second gate electrode G-II are formed in the first region I and the second region II, respectively, a plurality of first gate electrodes G-I and a plurality of second gate electrodes G-II may be disposed in the first and second active regions, respectively.

Although one first active region 110-I crosses the first region I, one of a source region and a drain region may be shared so that two gate electrodes pass through one active region so that two transistors may be formed in one active region. Similarly, although one second active region 110-II crosses the second region II, one of a source region and a drain region may be shared so that two gate electrodes pass through one active region so that two transistors may be formed in one active region.

Furthermore, although the first gate electrode G-I and the second gate electrode G-II extend in the same direction, aspects of the inventive concept are not limited thereto. For example, the first gate electrode G-I and the second gate electrode G-II may extend in different directions. For example, the first gate electrode G-I and the second gate electrode G-II may extend perpendicularly or at other angles to each other.

Although the first gate electrode G-I and the first active region 100-I, or the second gate electrode G-II and the second active region 100-II, cross perpendicularly to each other, respectively, aspects of the inventive concept are not limited thereto. That is, the first gate electrode G-I and the first active region 100-I or the second gate electrode G-II and the second active region 100-II may cross perpendicularly to each other or at an angle that is other than 90 degrees.

Hereinafter, FIGS. 2 through 26 are cross-sectional views illustrating an embodiment of a method of manufacturing a semiconductor device, according to aspects of the inventive concept. One cross sectional view is taken along lines A-A' in FIG. 1 which runs with the first active region 110-I and across first gate electrode G-I. Another cross-sectional view is taken along line B-B', which runs with second gate electrode G-II and across second active regions 110-II. And another cross-sectional view C-C' runs with one of the second active regions 110-II and across second gate electrode G-II. That is, directions of cross-sectional views of FIGS. 2 through 26 may be the same, perpendicular, or different. However, the same height represents the same level.

FIGS. 2 through 13B are cross-sectional views illustrating an exemplary embodiment of a method of manufacturing a semiconductor device, according to aspects of the inventive concept.

FIG. 2 is a cross-sectional view illustrating a semiconductor device useful for explaining an exemplary embodiment of a method of forming first and second trenches 102-I and 102-II so as to define the first active region 110-I and the second active region 110-II illustrated in FIG. 1.

Referring to FIG. 2, the first and second trenches 102-I and 102-II may be formed in a semiconductor substrate 100 so that the first and second active regions 110-I and 110-II protrude from the first and second trenches 102-I and 102-II. The first trench 102-I may be formed in the first region I so that the first active region 110-I protrudes from the first trench 1024, and the second trench 102-II may be formed in the second region II so that the second active region 110-II protrudes from the second trench 102-II.

The first trench 102-I and the second trench 102-II may be formed simultaneously by performing an etching process and may be formed to have the same height. The first trench 102-I and the second trench 102-II may be formed to have a depth in a range of about 2000 Å to about 3000 Å, for example.

The first region I and the second region II may also be referred to as a high voltage region I and a low voltage region II, respectively. A transistor that operates at a relatively high voltage may be formed in the high voltage region I, and a transistor that operates at a relatively low voltage may be formed in the low voltage region II. As an example, a transistor for an analog logic circuit may be formed in the high voltage region I, and a transistor for a digital logic circuit may be formed in the low voltage region II. As another example, a transistor for a complementary metal-oxide semiconductor (CMOS) image sensor or a transistor for a low noise circuit may be formed in the high voltage region I. And as yet another example, a transistor having an operating voltage of several to several tens of voltages may be formed in the high voltage region I, and a transistor having an operating voltage of several voltages or an operating voltage that is equal to or less than 1 V may be formed in the low voltage region I.

Reference numerals "-I" or "-II" attached to the same number throughout the specification may refer to elements formed in the first region I or the second region II, or corresponding elements formed in the first region I or the second region II.

The semiconductor substrate 100 may include a semiconductor material, for example, an IV group semiconductor, an III-V group compound semiconductor, or an II-VI group oxide semiconductor. For example, the IV group semiconductor may include silicon, germanium, silicon-germanium, or gallium-arsenic. The semiconductor substrate 100 may be provided with a bulk wafer or an epitaxial layer, or may be a silicon on insulator (SOI) substrate, as examples.

FIG. 3 is a cross-sectional view illustrating a semiconductor device useful for explaining an exemplary embodiment of a method of forming isolation layers 104-I and 104-II, according to aspects of the inventive concept.

Referring to FIG. 3, the isolation layers 104-I and 104-II may be formed to fill the first and second trenches 102-I and 102-II, respectively. The isolation layer 104-I may include silicon oxide, for example. The device isolation layer 104-I may have a multi-layer structure including silicon oxide and silicon nitride, for example.

A section 104-I of the isolation layer formed in the first trench 102-I and a section 104-II of the isolation layer formed in the second trench 102-II may be formed to expose a top surface of the first active region 110-I and a top surface of the second active region 110-II, respectively. The isolation layers 104-I and 104-II may be formed by performing a planarization process for exposing the top surfaces of the first active region 110-I and the second active region 110-II, for example, a chemical mechanical polishing (CMP) process, after isolation material layers are formed to cover the first and second active regions 110-I and 110-II.

After the isolation layers 104-I and 104-II are formed, a sacrificial layer 120 may be formed to cover the top surfaces of the first and second active regions 110-I and 110-II selectively. Although the sacrificial layer 120 covers both the top surfaces of the first and second active regions 110-I and 110-II and top surfaces of the isolation layers 104-I and 104-II, the sacrificial layer 120 may cover only the top surfaces of the first and second active layers 110-I and 110-II according to their formation method. When the sacrificial layer 120 is formed using thermal oxidation, the sacrificial layer 120 may be formed to cover only the top surfaces of the first and second active regions 110-I and 110-II. On the other hand, when the sacrificial layer 120 is formed using deposition, the sacrificial layer 120 may be formed to cover both the top surfaces of the first and second active regions 110-I and 110-II and the top surfaces of the isolation layers 104-I and 104-II. Since the sacrificial layer 120 may be formed to a very small thickness when compared to the isolation layers 104-I and 104-II, when the sacrificial layer 120 and the isolation layers 104-I and 104-II are formed of oxide, the isolation layers 104-I and 104-II and the sacrificial layer 120 may not be easily differentiated from each other even when the sacrificial layer 120 is formed on the isolation layers 104-I and 104-II.

After the sacrificial layer 120 is formed, ion implantation is performed for forming channels and wells in the first active region 110-I and the second active region 110-II and in lower portions of the first and second active regions 110-I and 110-II and in the isolation layers 104-I and 104-II of the semiconductor substrate 100. Types of impurities implanted by ion implantation may be determined according to types of transistors to be formed in the first active region 110-I and the second active region 110-II. As examples, such types of transistors can include an n-type metal-oxide semiconductor field-effect transistor (MOSFET) or a p-type MOSFET.

That is, an n-type MOSFET, a p-type MOSFET, or both the n-type and p-type MOSFETs may be formed in the first active region 110-I or in the second active region 110-II according to the types of the impurities implanted by ion implantation.

After ion implantation is performed, the sacrificial layer 120 may be removed.

FIG. 4 is a cross-sectional view of a semiconductor device useful for explaining an exemplary embodiment of a method of forming a first gate insulating layer 130, according to aspects of the inventive concept.

Referring to FIG. 4, the first gate insulating layer 130 may be formed to cover the top surfaces of the first and second active regions 110-I and 110-II. The first gate insulating layer 130 may be formed to have a thickness in a range of about 30 μm to about 200 μm, for example. The first gate insulating layer 130 may be formed of silicon oxide, for example, or silicon oxy-nitride in which some oxygen atoms of silicon oxide are substituted by nitrogen atoms. The first gate insulating layer 130 may be formed by forming silicon oxide using thermal oxidation, for example, and by changing silicon oxide into silicon oxy-nitride by performing thermal processing in a nitrogen atmosphere or nitrogen plasma.

Although the first gate insulating layer 130 covers both the top surfaces of the first and second active regions 110-I and 110-II and the top surfaces of the isolation layers 104-I and 104-II, only the top surfaces of the first and second active regions 110-I and 110-II may be covered according to their formation method. When the first gate insulating layer 130 is formed using thermal oxidation, the first gate insulating layer 130 may cover only the top surfaces of the first and second active regions 110-I and 110-II. On the other hand, when the first gate insulating layer 130 is formed using deposition, the first gate insulating layer 130 may cover both the top surfaces of the first and second active regions 110-I and 110-II and the top surfaces of the isolation layers 104-I and 104-II.

FIG. 5 is a cross-sectional view of a semiconductor device useful for explaining an exemplary embodiment of a method of forming a second isolation layer according to an aspect of the inventive concept.

Referring to FIGS. 4 and 5, a portion of the section 104-II of the isolation layer formed in the second region II may be removed to expose a portion of sides of the second active region 110-II. Remaining portions of the section 104-II of the isolation layer formed in the second region II may be referred to as a second isolation layer 104*a*-II. In this regard, the section 104-I of the isolation layer formed in the first region I may not be removed and remains and may be referred to as a first isolation layer 104-I.

An upper portion of the sides of the second active region 110-II, for example, in a range of about 300 μm to about 400 μm, may be exposed by the second isolation layer 104*a*-II. In order to form the second isolation layer 104*a*-II, a portion of the first gate insulating layer 130 formed in the second region II may be removed.

In order to form the second isolation layer 104*a*-II, an etching process or an etchback process may be performed after a mask layer (not shown) is formed, and which does not expose, the first region I.

Figure 6:
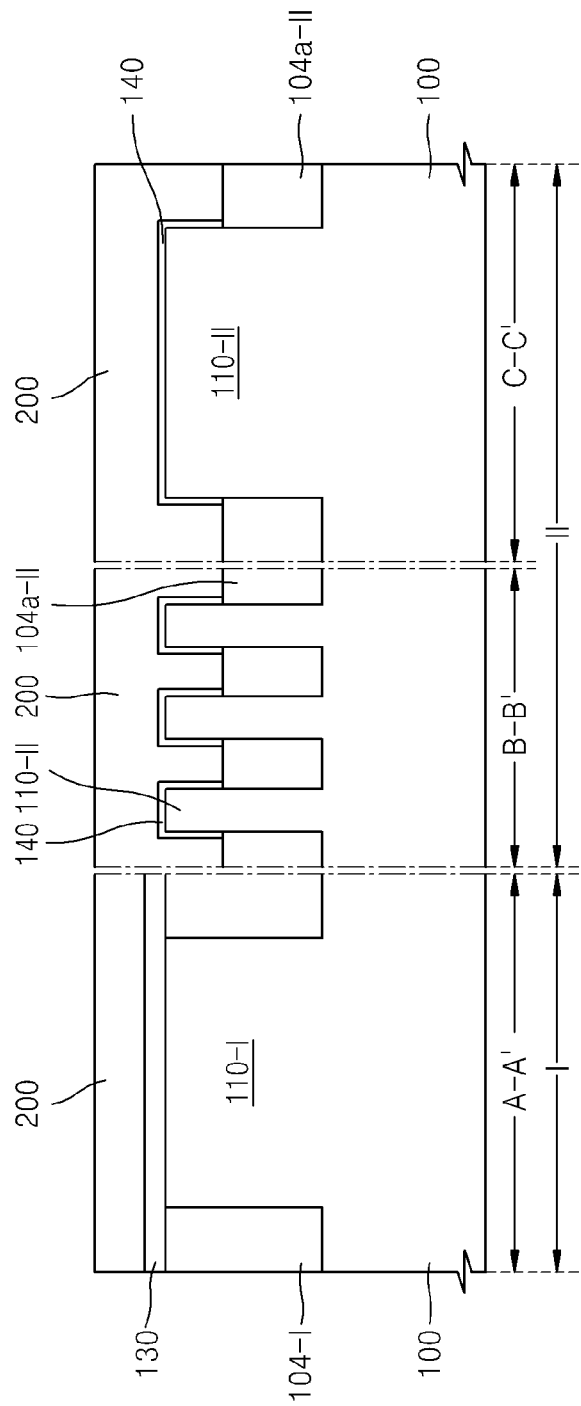

FIG. 6 is a cross-sectional view of a semiconductor device useful for explaining an exemplary embodiment of a method of forming a first gate material layer 200 according to an aspect of the inventive concept.

Referring to FIG. 6, after the first isolation layer 104-I and the second isolation layer 104*a*-II are formed, the first gate material layer 200 may be formed to cover the entire surface of the semiconductor substrate 100. The first gate material layer 200 may be formed of doped polysilicon, for example. Alternatively, the first gate material layer 200 may be formed of amorphous silicon, as another example, and then may be changed into polysilicon by performing thermal processing in a subsequent process. The first gate material layer 200 may be formed to have a thickness in a range of about 1,000 Å to about 3,000 Å, for example.

Before the first gate material layer 200 is formed, a buffer oxide layer 140 may be formed to cover the second active region 110-II that is exposed by the second isolation layer 104*a*-II. The buffer oxide layer 140 may be formed of silicon oxide using thermal oxidation, for example. When the buffer oxide layer 140 is formed using thermal oxidation, since the first active region 110-I is covered by the first gate insulating layer 130, the buffer oxide layer 140 may be formed only on the second active region 110-II. Thus, the buffer oxide layer 140 may be formed on the exposed top surface and on the exposed sides of protrusions in the second active region 110-II.

The first gate material layer 200 in the first region I may be formed on the first active region 110-I so that the first gate insulating layer 130 is disposed between the first gate material layer 200 and the first active region 110-I.

The first gate material layer 200 may be formed by forming a preparatory first gate material layer (not shown) and then by performing a planarization process, for example, a chemical mechanical polishing (CMP) process. That is, a top surface of the first gate material layer 200 may be at the same level in the first region I and the second region II. Thus, when a thickness of the buffer oxide layer 140 is smaller than that of the first gate insulating layer 130, a thickness of portions of the first gate material layer 200 in the first active region 110-I may be smaller that that of the first gate material layer 200 in the second active region 110-II.

Figure 7:
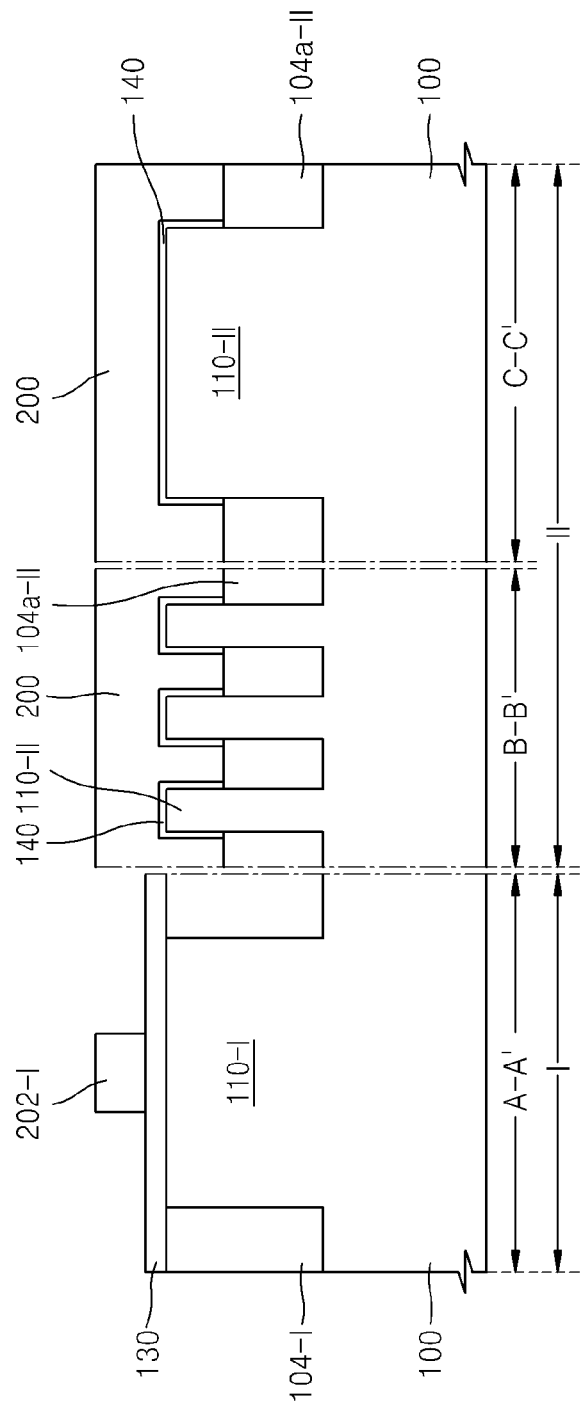

FIG. 7 is a cross-sectional view of a semiconductor device useful for explaining an exemplary embodiment of a method of forming a first gate electrode 202-I according an aspect of the inventive concept.

Referring to FIGS. 6 and 7, the first gate electrode 202-I may be formed by patterning portions of the first gate material layer 200 in the first region I using an etching process. In this regard, the first gate material layer 200 in the second region II may remain.

Although not shown, a portion of the first gate insulating layer 130 under the first gate electrode 202-I remains. However, a portion of the first gate insulating layer 130 that is exposed by the first gate electrode 202-I may be removed by over-etching and may result in a height difference between the portion of the first gate insulating layer 130 exposed by the first gate electrode 202-I and the portion of the first gate insulating layer 130 under the first gate electrode 202-I. The first gate electrode 202-I may cross the first active region 110-I and may extend from the first active region 110-I.

FIG. 8 is a cross-sectional view of a semiconductor device useful for explaining an exemplary embodiment of a method of forming a high voltage transistor TR-I according to an aspect of the inventive concept.

Referring to FIG. 8, in order to form the high voltage transistor TR-I, a first source/drain region 114-I is formed by implanting an impurity into the first active region 110-I. In order to form the first source/drain region 114-I, after an impurity is implanted into the first active region 110-I by performing an ion implantation process, first thermal processing may be performed to disperse the implanted impurity or activate the first source/drain region 114-I. The first thermal processing may be performed for several seconds or minutes at a temperature of 900° C. to 1100° C. Since the first thermal processing is performed for a relatively long time, the first source/drain region 114-I may have a greater thickness than that of a second source/drain region, which will be described below.

Thus, the high voltage transistor TR-I, including the first source/drain region 114-I that is disposed at both sides of and within the first active region 1104, and the first gate insulating layer 130 and the first gate electrode 202-I that are sequentially disposed on the first active region 110-I, may be formed.

In order to form the high voltage transistor TR-I, a first spacer layer 204-I and a first lightly-doped source and drain (LDD) region 112-I may be further formed as well as the first source/drain region 114-I. In this regard, the first LDD region 112-I may be first formed by implanting an impurity into the first active region 110-I, using the first gate electrode 202-I as a mask, and then the first spacer layer 204-I may be disposed at both sides of the first gate electrode 202-I. Thereafter, the first source/drain region 114-I may be formed by implanting an impurity into the first active region 110-I using the first gate electrode 202-I and the first spacer layer 204-I as a mask.

FIG. 9 is a cross-sectional view of a semiconductor device useful for explaining an exemplary embodiment of a method of forming a dummy gate electrode according to an aspect of the inventive concept.

Referring to FIGS. 8 and 9, a portion of the first gate material layer 200 of the second region II may be patterned using an etching process, thereby forming a dummy gate electrode 202-II. The dummy gate electrode 202-II may cross the second active region 110-II and may extend upwardly from the second active region 110-II.

After the dummy gate electrode 202-II is formed, a first mask layer 510 may be selectively formed to cover the first region I.

Figure 10A:
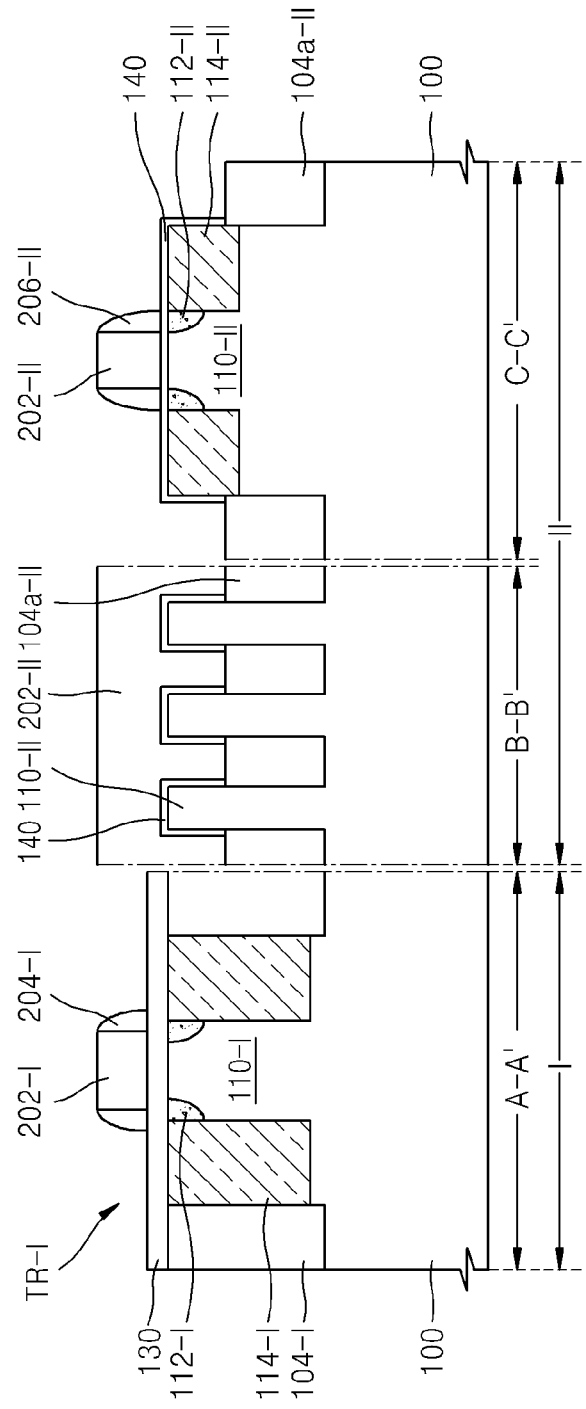

FIG. 10A is a cross-sectional view of a semiconductor device useful for explaining an exemplary embodiment of a method of forming a second source/drain region 114-II according to an aspect of the inventive concept.

Referring to FIG. 10A, the second source/drain region 114-II is formed by implanting an impurity into the second active region 110-II. In order to form the second source/drain region 114-II, after implanting the impurity into the second active region 110-II by using an ion implantation process, second thermal processing is performed to diffuse the implanted impurity or activate the second source/drain region 114-II. The second thermal processing may be performed by rapid thermal processing (RTP) using a laser or a lamp, as examples. Since the second thermal processing is performed for a relatively short time compared to the first thermal processing described above, a thickness of the second source/drain region 114-II may be smaller than that of the first source/drain region 114-I. In addition, since the first source/drain region 114-I has a thickness that is greater than that of the second source/drain region 114-II, the effect of the second source/drain region 114-II extending due to thermal processing for activating the second source/drain region 114-II may be minimized.

In addition, a second spacer layer 206-II and a second LDD region 112-II, as well as the second source/drain region 114-II, may be further formed. In this regard, the second LDD region 112-II may be first formed by implanting an impurity into the second active region 110-II using the dummy gate electrode 202-II as a mask, then, the second spacer layer 206-II may be disposed at both sides of the dummy gate electrode 202-II. Thereafter, the second source/drain region 114-II may be formed by implanting an impurity into the second active region 110-II using the dummy gate electrode 202-II and the second spacer layer 206-II as a mask. Subsequently, the first mask layer 510 illustrated in FIG. 9 may be removed.

Figure 10B:
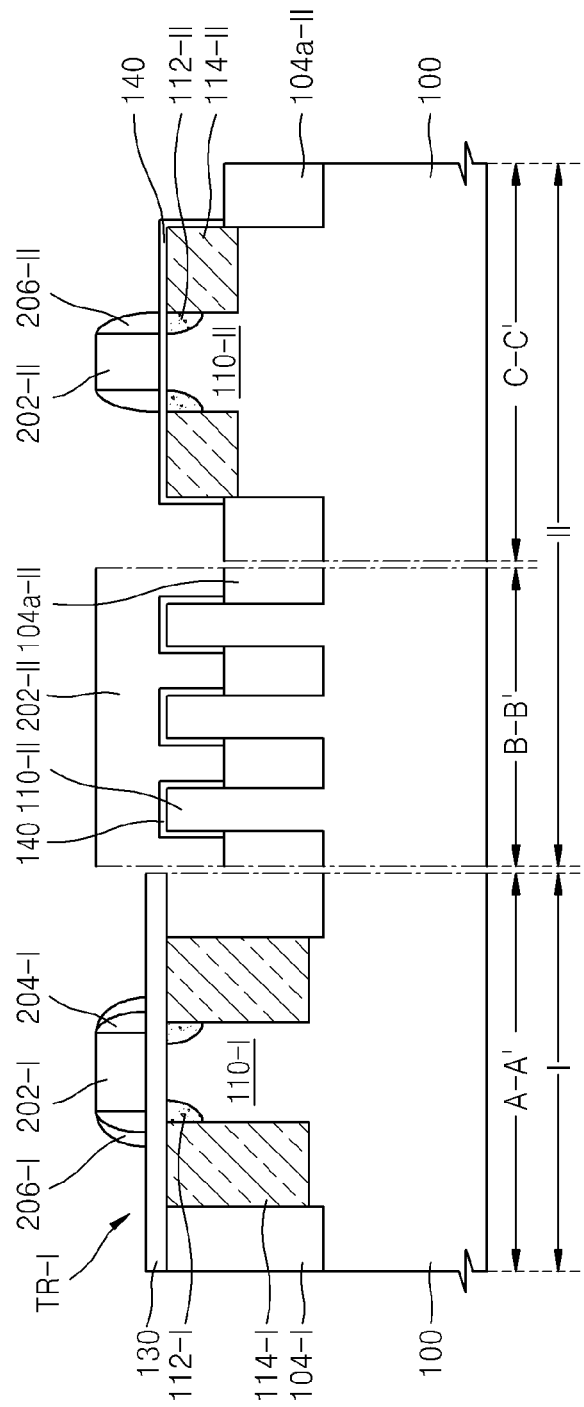

FIG. 10B is a cross-sectional view of a semiconductor device useful for explaining an exemplary embodiment of a method of forming a second source/drain region 114-II according to a modification of FIG. 10A. In detail, FIG. 10B illustrates subsequent processes that are performed when the first mask layer 510 of FIG. 9 is not formed.

Referring to FIG. 10B, a second LDD region 112-II, a second spacer layer 206-II, and a second source/drain region 114-II may be formed in the second region II, as discussed above. When the second spacer layer 206-II is formed, an auxiliary spacer layer 206-I may also be formed in the first region I.

Referring to FIGS. 9, 10A, and 10B, when a second spacer material layer (not shown) for forming the second spacer layer 206-II is formed in a state where the first mask layer 510 covers the first region I, since the second spacer material layer (not shown) is formed flat on a top surface of the first mask layer 510 in the first region I, all portions of the second spacer material layer (not shown) formed in the first region I may be removed by performing an anisotropic etching process or an etchback process for forming the second spacer layer 206-II. However, when the first mask layer 510 is not used, the second spacer material layer (not shown) may remain on the sides of each first spacer layer 204-I, and thus an auxiliary spacer layer 206-I may be formed.

Thus, a thickness of each of the spacer layers formed on sides of the first gate electrode 202-I may vary according to the usage of the first mask layer 510. For example, when the first spacer layer 204-I and the second spacer layer 206-II are formed of the same or similar material to have the same or similar thickness, since only the first spacer layer 204-I is formed on the sides of the first gate electrode 202-I when the first mask layer 510 is used, the first spacer layer 204-I may have a similar thickness to that of the second spacer layer 206-II. However, since the first spacer layer 204-I and the auxiliary spacer layer 206-I are formed on the sides of the first gate electrode 202-I when the first mask layer 510 is not used, the first spacer layer 204-I and the auxiliary spacer layer 206-I may have a thickness that is approximately twice that of the second spacer layer 206-II.

Here, a thickness of each of the spacer layers refers to a thickness in a direction perpendicular to sides at which the spacer layers are formed and, thus, refers to a thickness in a horizontal direction with respect to the semiconductor substrate 100, which also extends in the horizontal direction.

Figure 11:
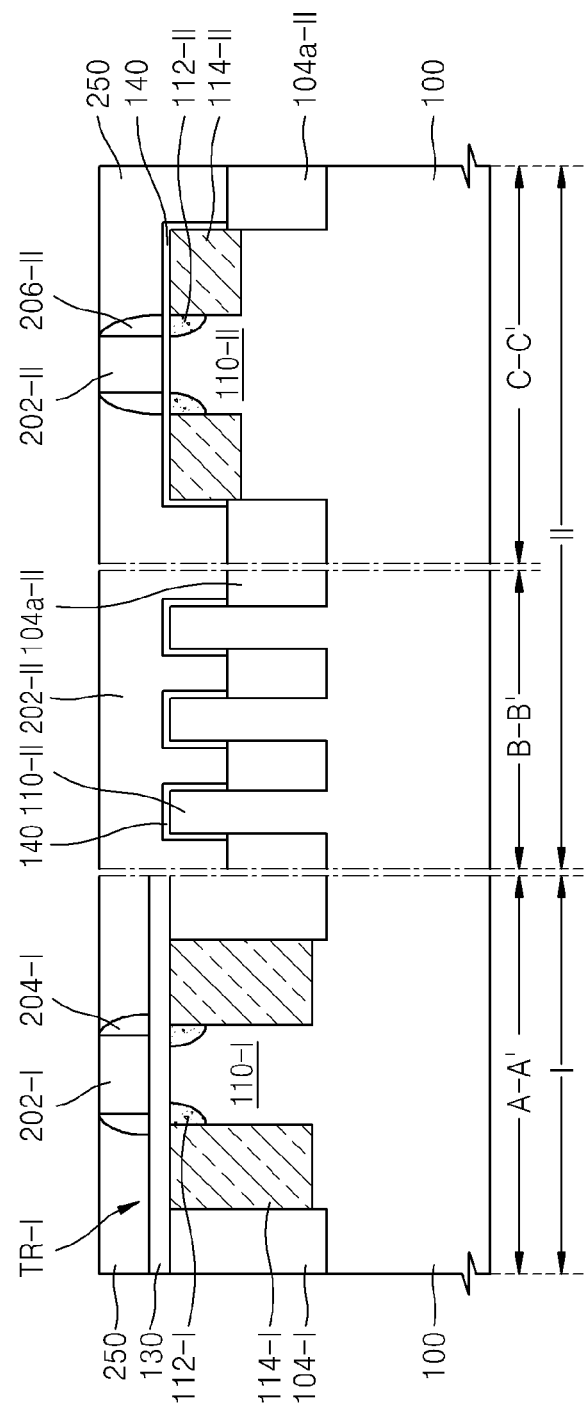

FIG. 11 is a cross-sectional view of a semiconductor device useful for explaining an exemplary embodiment of a method of forming an interlayer insulating layer 250 according to an aspect of the inventive concept.

Referring to FIG. 11, the interlayer insulating layer 250 for covering the semiconductor substrate 100 may be formed by exposing a top surface of the first gate electrode 202-I and a top surface of the dummy gate electrode 202-II. In order to form the interlayer insulating layer 250, after a preparatory interlayer insulating layer (not shown) for covering both the top surface of the first gate electrode 202-I and the top surface of the dummy gate electrode 202-II is formed, a planarization process, such as a CMP process, is performed to expose the top surface of the first gate electrode 202-I and the top surface of the dummy gate electrode 202-II.

Figure 12:
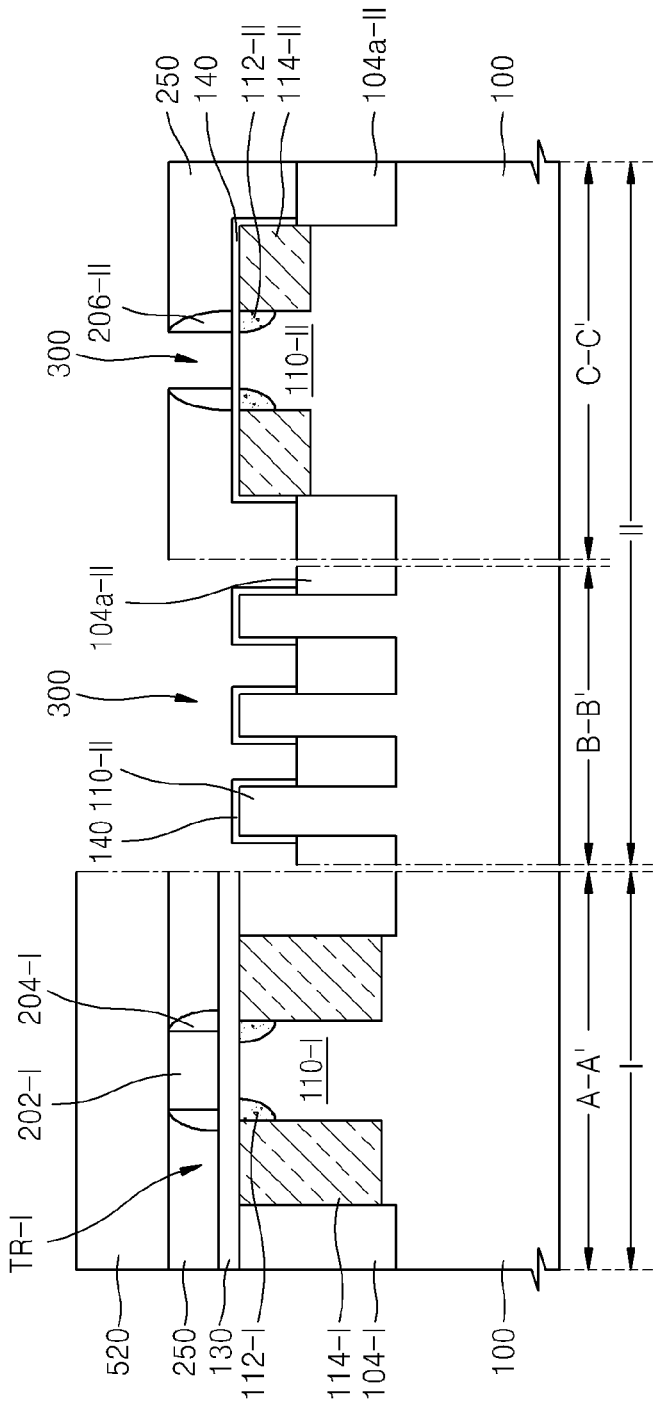

FIG. 12 is a cross-sectional view of a semiconductor device useful for explaining an exemplary embodiment of a method of removing the dummy gate electrode 202-II according to an aspect of the inventive concept.

Referring to FIGS. 11 and 12, after the first region I is covered by forming a second mask layer 520, only the dummy gate electrode 202-II may be selectively removed from the exposed second region II. In order to remove the dummy gate electrode 202-II, a wet or dry etching process in which the interlayer insulating layer 250, the buffer oxide layer 140, and the second mask layer 520 have etch selectivities with respect to the dummy gate electrode 202-II may be performed. In a space formed by removing the dummy gate electrode 202-II, a recess 300 is formed and is surrounded by the remaining buffer oxide layer 140 and the remaining second spacer layer 206-II.

Figure 13A:
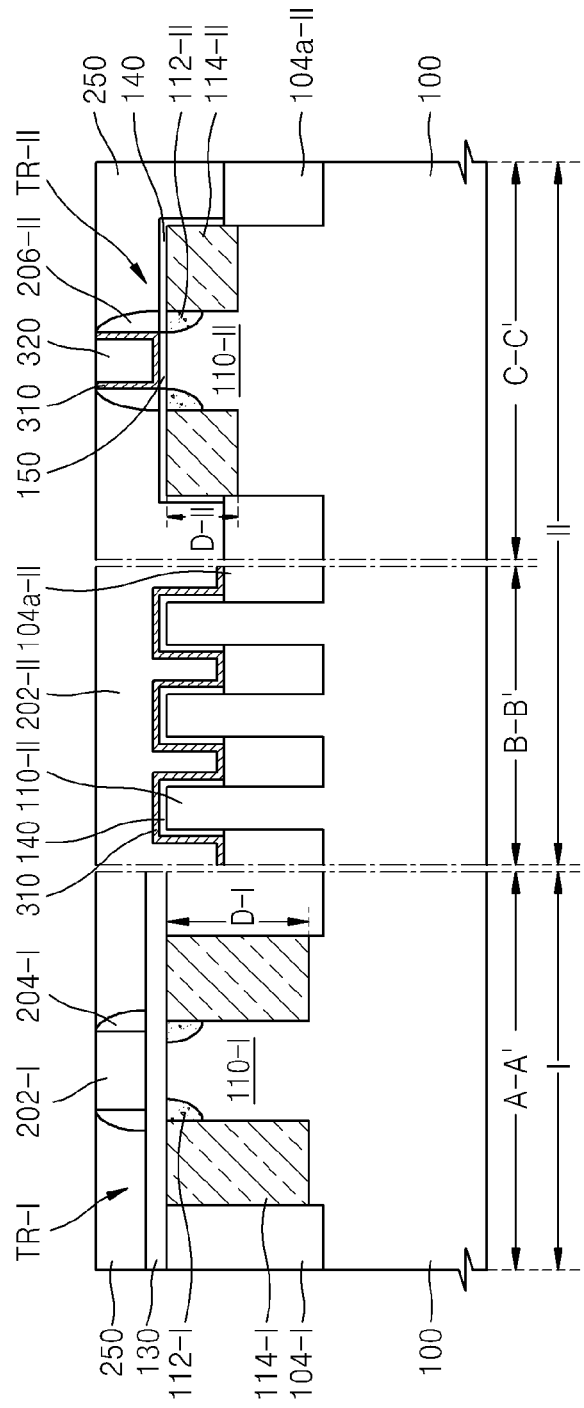

FIG. 13A is a cross-sectional view of a semiconductor device useful for explaining an exemplary embodiment of a method of forming a low voltage transistor TR-II according to an aspect of the inventive concept.

Referring to FIGS. 12 and 13A, the second gate electrode 320 may be formed to fill the recess 300. Before the second gate electrode 320 is formed, a second gate insulating layer 310 is formed to cover the surface exposed in the recess 300. That is, the second gate insulating layer 310 may cover the surface exposed in the recess 300, such as the bottom and sides of recess 300. The second gate insulating layer 310 may be formed on interior sidewalls of the second spacer layer 206-II exposed in the recess 300 and a bottom surface of the recess 300 between the second spacer layers 206-II. The second gate electrode 320 may be formed to fill an inside of the second gate insulating layer 310. Thus, the second gate insulating layer 310 may extend from a space between the second active region 110-II and the second gate electrode 320 to a space between the second gate electrode 320 and the second spacer layer 206-II.

In order to form the second gate insulating layer 310 and the second gate electrode 320, after a preparatory second gate insulating material layer (not shown) and a preparatory second gate material layer (not shown) are formed to cover the second region II, a planarization process, such as a CMP process, may be performed so that the interlayer insulating layer 250 is exposed.

Thus, the low voltage transistor TR-II including the second source/drain region 114-II that is disposed at both sides of the second active region 110-II, and the second gate insulating layer 310 and the second gate electrode 320 that are sequentially disposed on the second active region 110-II may be formed. A thickness of the second gate insulating layer 310 may be smaller than that of the first gate insulating layer 130. That is, since the first gate insulating layer 130 is used as a gate insulating layer for the high voltage transistor TR-I, a thickness of the first gate insulating layer 130 may be greater than that of the second gate insulating layer 310, which is used as a gate insulating layer for the low voltage transistor TR-II.

The second gate electrode 320 may be formed of material having lower resistivity than that of the first gate electrode 202-I. The second gate electrode 320 may be formed of metal or conductive metal nitride, for example. The second gate electrode 320 may include W, WN, Ti, TiN, or Cu, as examples.

The second gate insulating layer 310 may be formed of material having a high dielectric constant. The second gate insulating layer 310 may formed of an oxide of hafnium, zirconium, or aluminum or silicate, or one or a plurality of metal oxides or metal silicates, such as hafnium-zirconium oxide or silicate, as examples.

Generally, a material having a high dielectric constant refers to material having a higher dielectric constant than that of silicon oxide in a broad sense. However, a material having a high dielectric constant according to the inventive concept refers to a material having a higher dielectric constant than silicon oxide or silicon oxy-nitride, or a combination of silicon oxide and silicon nitride, for example, oxide-nitride-oxide (ONO). Therefore, a material having a high dielectric constant refers to a material having a higher dielectric constant than silicon oxide or material having an increased dielectric constant based on silicon oxide. Thus, the second gate insulating layer 310 may be formed of material having a higher dielectric constant than that of the first gate insulating layer 130.

Before the second gate insulating layer 310 is formed, the buffer layer 140 exposed in the recess 300 may be selectively removed, thereby exposing the second active region 110-II. Next, an interfacial oxide layer 150 may be formed on the second active region 110-II exposed in the recess 300. The interfacial oxide layer 150 may be formed of silicon oxide formed by thermal oxidation, for example. The interfacial oxide layer 150 may be formed only on the second active region 110-II exposed in the recess 300. When the interfacial oxide layer 150 is formed, the second gate insulating layer 310 and the second gate electrode 320 may be sequentially formed in the recess 300 in which the interfacial oxide layer 150 is formed.

When the interfacial oxide layer 150 is formed, the interfacial oxide layer 150 and the second gate insulating layer 310 may serve as a gate insulating layer of the low voltage transistor TR-II. The interfacial oxide layer 150 may improve interfacial characteristics between the second active region 110-II and the second gate insulating layer 310. In the presently preferred embodiments, the interfacial oxide layer 150 may have a thickness in a range of about several μm up to about 20 μm.

Comparing the high voltage transistor TR-I and the low voltage transistor TR-II, the second source/drain region 114-II of the low voltage transistor TR-II may be formed to have a smaller thickness than that of the first source/drain region 114-I of the high voltage transistor TR-1. That is, a first thickness D-1, which is a thickness of the first source/drain region 114-I, may be greater than a second thickness D-II, which is a thickness of the second source/drain region 114-II.

The top surface of the first source/drain region 114-I, which is also the top surface of the first active region 110-I, and the top surface of the second source/drain region 114-II, which is also the top surface of the second active region 110-II, may be at the same level. Notwithstanding the foregoing, a bottom surface of the second source/drain region 114-II may be at a higher level than that of the first source/drain region 114-I.

A top surface of the first isolation layer 104-I that surrounds the high voltage transistor TR-I may be at a higher level than that of the second isolation layer 104a-II that surrounds the low voltage transistor TR-II.

The high voltage transistor TR-I may be a flat transistor in which a channel region may be formed along the top surface of the first active region 110-I, but the low voltage transistor TR-II may be a Fin Field Effect Transistor (FinFET) in which a channel region is formed on the top surface of the second active region 110-II that extends above the top surface of the second isolation layer 104a-II and both sides of the second active region 110-II, and which is disposed beneath the second gate electrode 320.

Thus, a semiconductor device including the high voltage transistor TR-I and the low voltage transistor TR-II may be formed. That is, the first source/drain region 114-I of the high voltage transistor TR-I is first formed, and then, the second source/drain region 114-II of the low voltage transistor TR-II is formed so that the high voltage transistor TR-I having a relatively large thermal budget and the low voltage transistor TR-II having a relatively small thermal budget may be formed in one semiconductor device. In addition, the size of the low voltage transistor TR-II may be reduced using a gate insulating layer and a metallic gate electrode formed of material having a high dielectric constant.

That is, the high voltage transistor TR-I including a gate insulating layer having high reliability that is suitable for use with a high voltage, while also having a low leakage current and excellent noise characteristics. The low voltage transistor TR-II that may operate at a high speed due to a high degree of integration, may be formed using additional thermal processing, may reduce a short channel effect, and may control a threshold voltage easily. The high voltage transistor TR-I and the low voltage transistor TR-II may be implemented together in one semiconductor device, according to aspects of the present invention.

In addition, since processes of forming the high voltage transistor TR-I and the low voltage transistor TR-II, respectively, are very similar to each other, the overall number of processes may be reduced. Additionally, the number of photomasks required for the processes may be reduced. As a result, a manufacturing time and a manufacturing cost may be reduced.

Since the top surface of the high voltage transistor TR-I and the top surface of the low voltage transistor TR-II, i.e., the top surface of the first gate electrode 202-I and the top surface of the second gate electrode 320 are at the same level, there is no height difference between the high voltage region I and the low voltage region II. Thus, a process margin for various processes, including a photolithography process, may be substantially guaranteed when subsequent processes are performed.

Figure 13B:
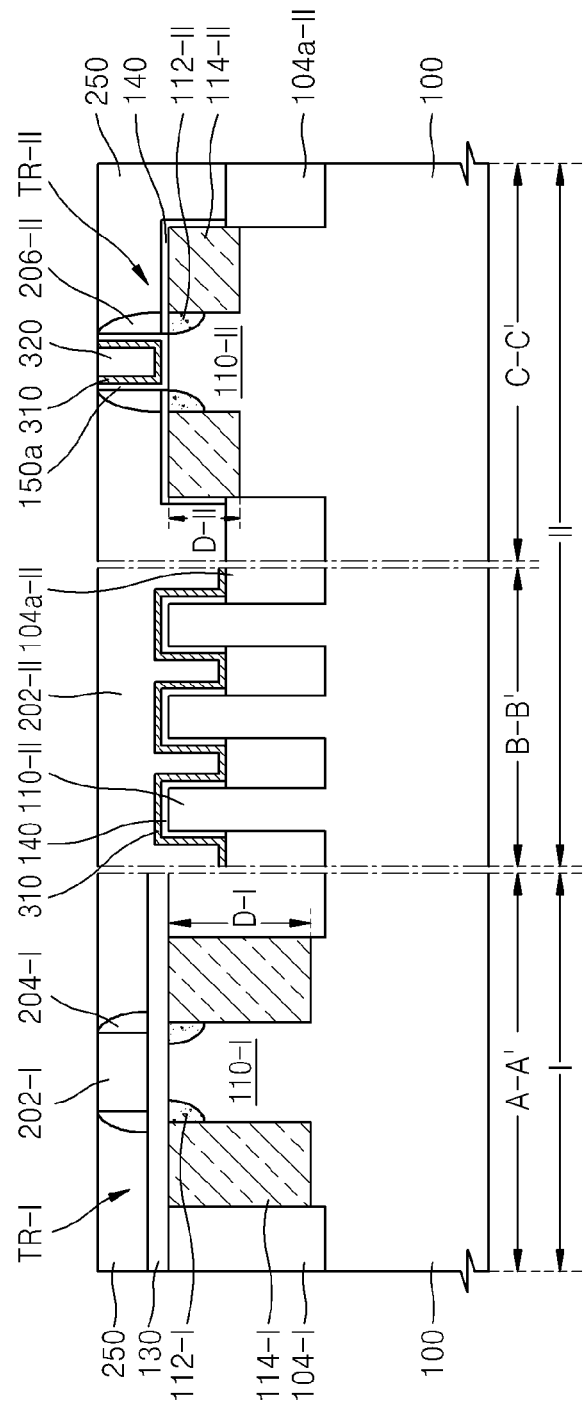

FIG. 13B is a cross-sectional view of a semiconductor device useful for explaining an exemplary embodiment of a method of forming a low voltage transistor according to a modification of the method described with respect to FIG. 13A.

Referring to FIGS. 12, 13A, and 13B, unlike the interfacial oxide layer 150 of the low voltage transistor TR-II of FIG. 13A, in the low voltage transistor TR-II of FIG. 13B an interfacial oxide layer 150a may be formed to cover the surface exposed in the recess 300, including the bottom and sides of recess 300. In addition, the second gate insulating layer 310 may be layered onto an inside of the interfacial oxide layer 150a. The second gate electrode 320 may be formed to fill the inside of the second gate insulating layer 310.

In this regard, in order to form the interfacial oxide layer 150a, the second gate insulating layer 310, and the second gate electrode 320, after a preparatory interfacial oxide material layer (not shown), a preparatory second gate insulating material layer (not shown), and a preparatory second gate material layer (not shown) may be formed to cover the second region II, a planarization process, such as a CMP process, may be performed to expose an interlayer insulating layer 250. The interfacial oxide layer 150a may be formed by atomic layer deposition (ALD) or chemical vapor deposition (CVD), as examples.

With reference to FIG. 1, the first gate electrode G-I and the second gate electrode G-II of FIG. 1 may correspond to the first gate electrode 202-I and the second gate electrode 320 described with reference to FIGS. 7 through 13B, respectively.

FIGS. 14 through 21 are cross-sectional views illustrating an exemplary embodiment of a method of manufacturing a semiconductor device, according to another aspect of the inventive concept. Description that would be redundant with that of FIGS. 2 through 13B may be omitted.

Figure 14:
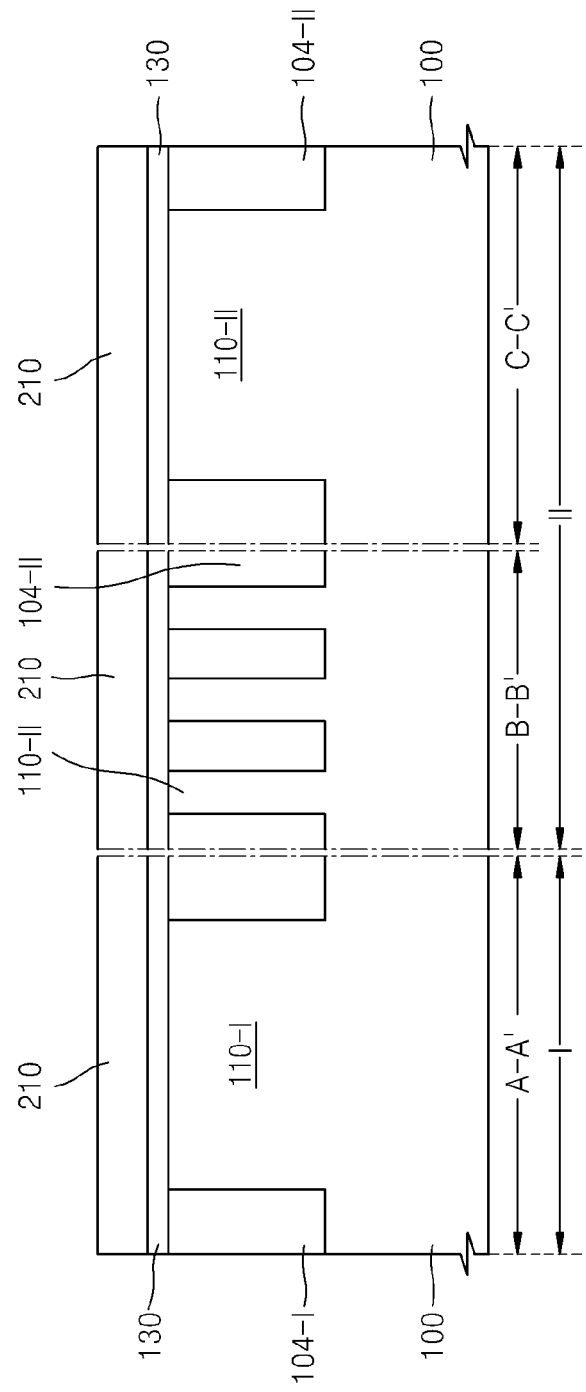
FIGS. 14 through 21 are cross-sectional views illustrating a semiconductor device useful for explaining an exemplary embodiment of a method of manufacturing a semiconductor device, according to another aspect of the inventive concept.

FIG. 14 is a cross-sectional view illustrating a semiconductor device useful for explaining an exemplary embodiment of a method of forming a first gate material layer according to another aspect of the inventive concept. In detail, FIG. 14 is a cross-sectional view illustrating the device after the first gate insulating layer 130 of FIG. 4 is formed.

Referring to FIG. 14, a first gate material layer 210 may be formed to cover the entire surface of the semiconductor substrate 100. Comparing the device of FIG. 14 to that of FIG. 6, in FIG. 14 an upper portion of a section 104-II of an isolation layer formed in the second region II is not removed. Thus, in FIG. 14, the section 104-II of the second isolation layer formed in the second region II may refer to the second isolation layer 104-II. The first gate material layer 210 may be formed of doped polysilicon, for example. Since the first gate material layer 210 is formed on the first gate insulating layer 130 having no height difference within the first gate material layer 210, the first gate material layer 210 may be formed without performing an additional planarization process. In addition, the first gate material layer 210 may have the same thickness in the first region I and the second region II.

Figure 15:
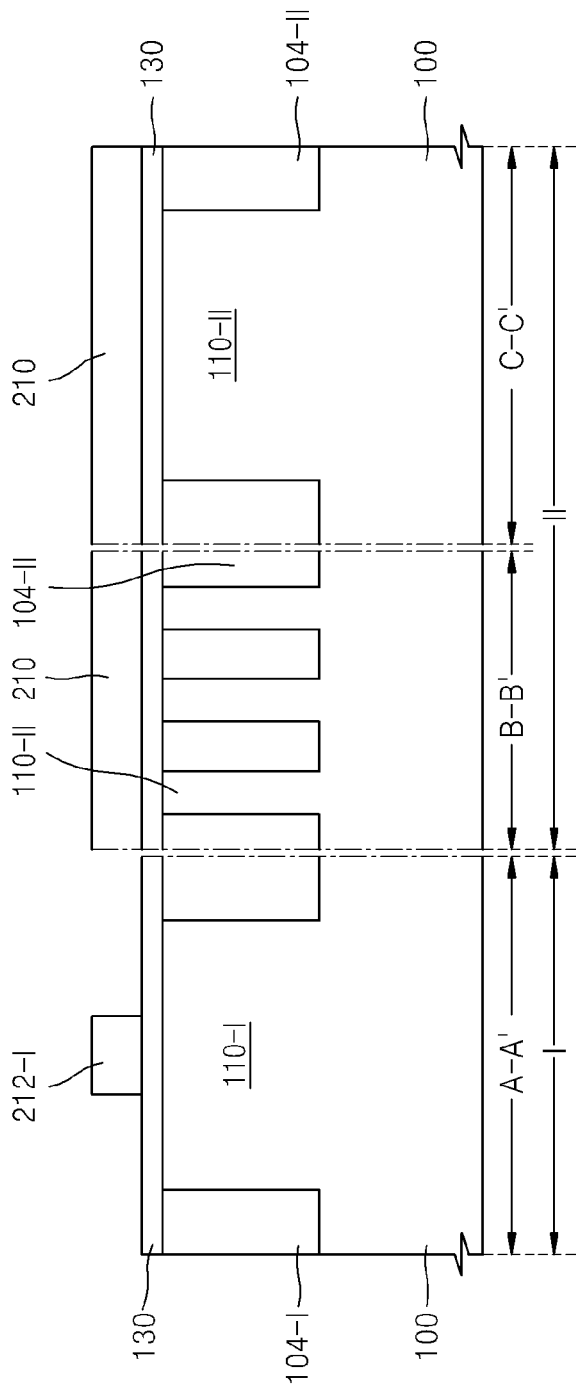

FIG. 15 is a cross-sectional view of a semiconductor device useful for explaining an exemplary embodiment of a method of forming a first gate electrode 212-I according to another aspect of the inventive concept.

Referring to FIGS. 14 and 15, the first gate electrode 212-I may be formed by patterning a portion of the first gate material layer 210 formed in the first region I by using an etching process. In this regard, the portion of the first gate material layer 210 formed in the second region II may remain.

Figure 16:
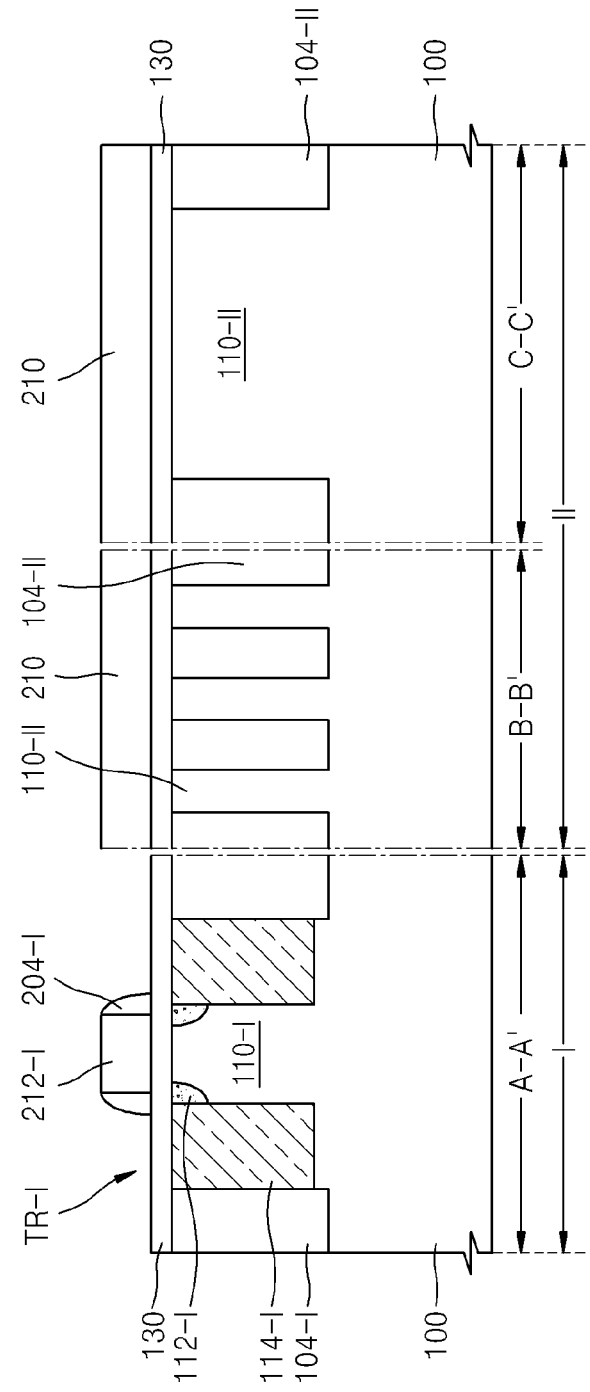

FIG. 16 is a cross-sectional view of a semiconductor device useful for explaining an exemplary embodiment of a method of forming a high voltage transistor TR-I according to another aspect of the inventive concept.

Referring to FIG. 16, in order to form the high voltage transistor TR-I, the first source/drain region 114-I may be formed in the first active region 110-I. Thus, the high voltage transistor TR-I may be formed, including the first source/drain region 114-I that is disposed at both ends of the first active region 110-I, and the first gate insulating layer 130 and the first gate electrode 212-I that are sequentially disposed on the first active region 110-I.

In order to form the high voltage transistor TR-I, a first spacer layer 204-I and a first LDD region 112-I, as well as the first source/drain region 114-I, may be further formed.

Figure 17:
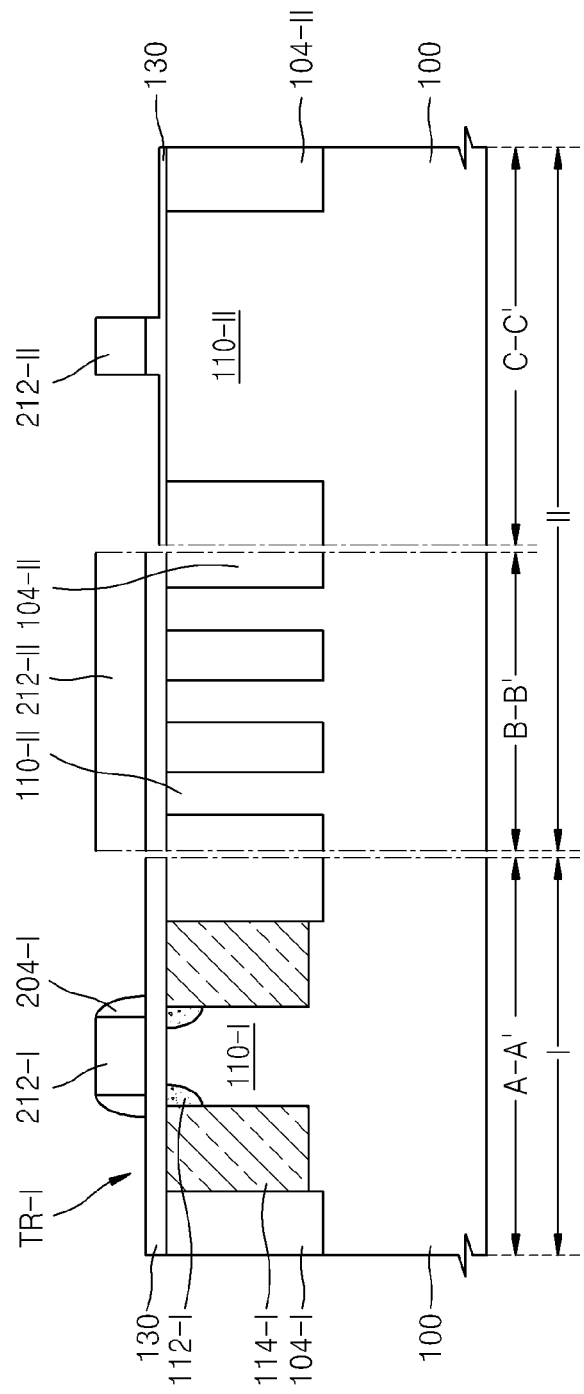

FIG. 17 is a cross-sectional view of a semiconductor device useful for explaining an exemplary embodiment of a method of forming a dummy gate electrode according to another aspect of the inventive concept.

Referring to FIGS. 16 and 17, a portion of a first gate material layer 210 formed in the second region II may be patterned using an etching process, thereby forming a dummy gate electrode 212-II.

When the dummy gate electrode 212-II is formed, a portion of the first gate insulating layer 130 that is exposed by the dummy gate electrode 212-II may be removed by over-etching and may constitute a height difference with the remaining portions of the first gate insulating layer 130 under the dummy gate electrode 212-I.

Figure 18:
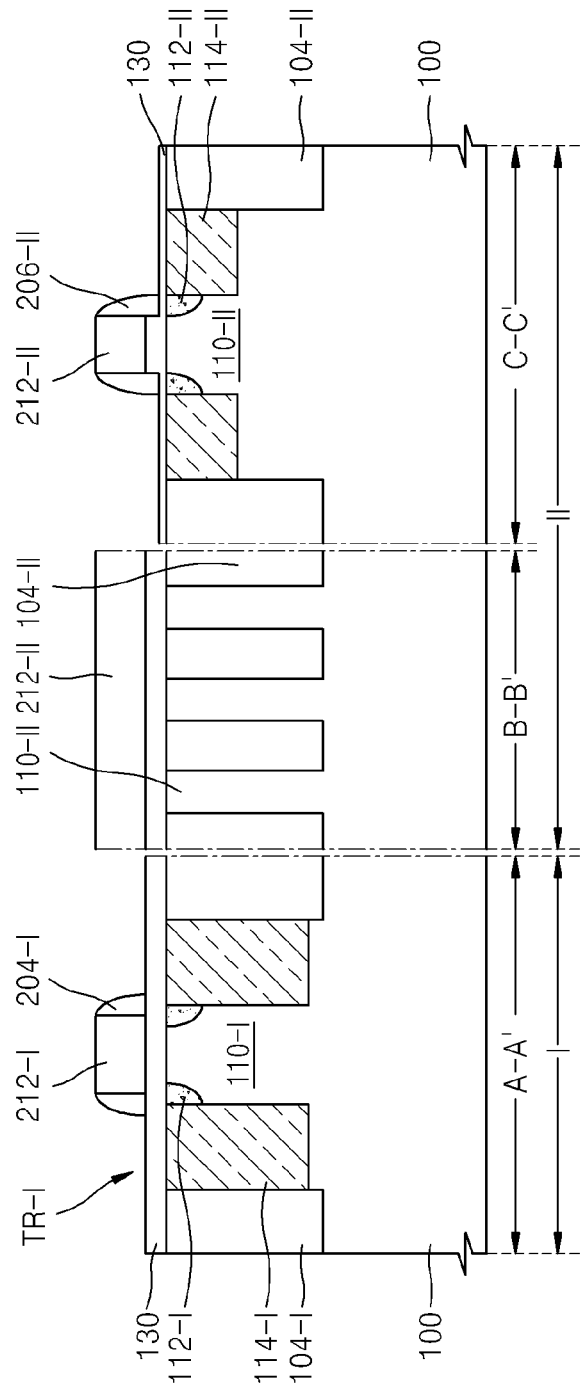

FIG. 18 is a cross-sectional view of a semiconductor device useful for explaining an exemplary embodiment of a method of forming a second source/drain region 114-II according to another aspect of the inventive concept.

Referring to FIG. 18, the second source/drain region 114-II may be formed in the second active region 110-II. The second source/drain region 114-II may have a smaller thickness than that of the first source/drain region 114-I in the first active region 110-I.

In addition, a second spacer layer 206-II and a second LDD region 112-II as well as the second source/drain region 114-II may be further formed.

In addition, although not shown, the first mask layer 510 may be selectively formed, or the auxiliary spacer layer 206-I may be formed, as illustrated in FIGS. 9 through 10B.

Figure 19:
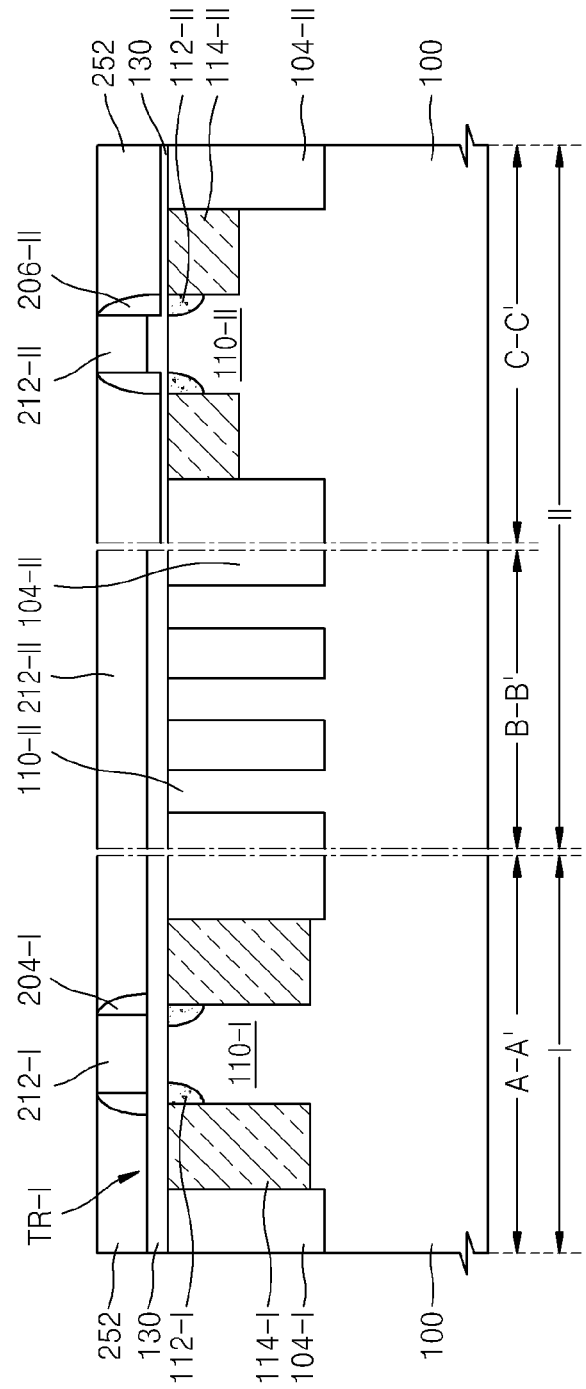

FIG. 19 is a cross-sectional view of a semiconductor device useful for explaining an exemplary embodiment of a method of forming an interlayer insulating layer 252 according to another aspect of the inventive concept.

Referring to FIG. 19, the interlayer insulating layer 252 for covering the semiconductor substrate 100 may be formed to expose, e.g., by planarization, a top surface of the first gate electrode 212-I and a top surface of the dummy gate electrode 212-II.

Figure 20:
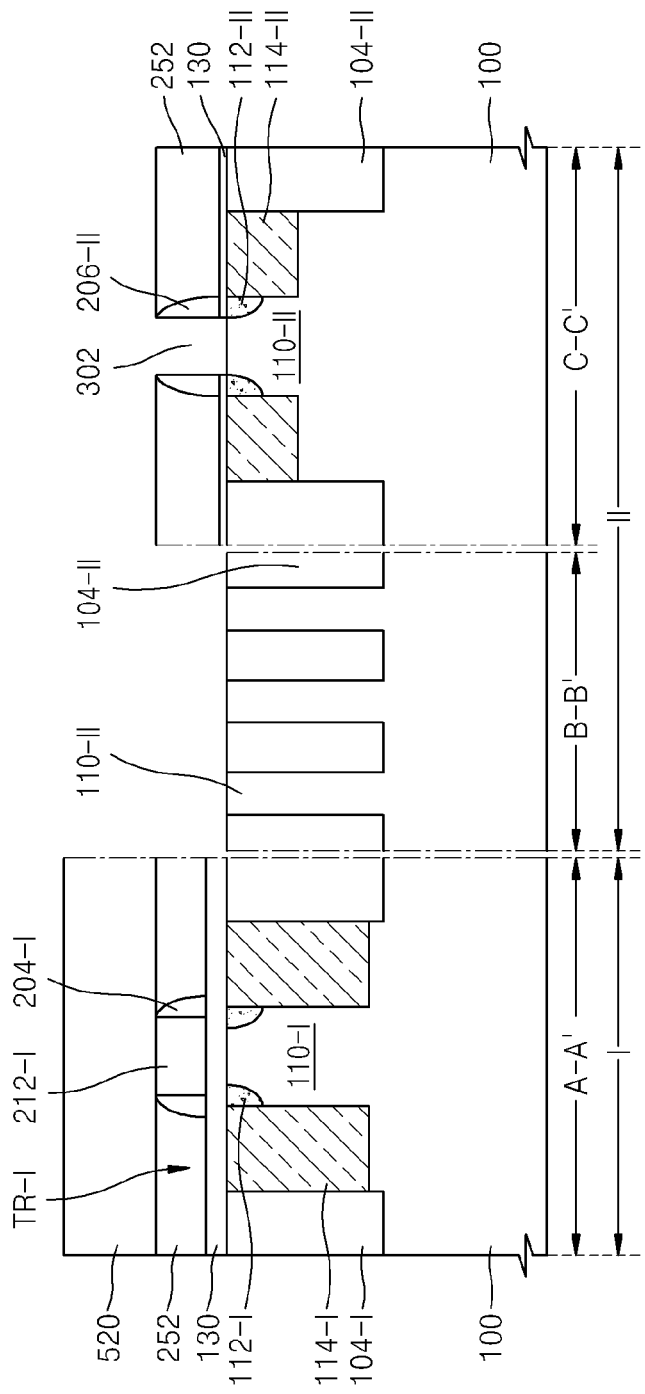

FIG. 20 is a cross-sectional view of a semiconductor device useful for explaining an exemplary embodiment of a method of removing a dummy gate electrode 212-II according to another aspect of the inventive concept.

Referring to FIGS. 19 and 20, after the first region I is covered by forming a second mask layer 520, only the dummy gate electrode 212-II may be selectively removed from the exposed second region I, thereby forming a recess 302. Additionally, a portion of the first gate insulating layer 130 exposed in the recess 302 is selectively removed, thereby exposing a portion of the second active region 110-II. When the dummy gate electrode 212-II and the portion of the first gate insulating layer 130 are removed, the recess 302 is formed and is surrounded by the second active region 110-II at the recess bottom and the second spacer layer 206-II at the recess sides.

Figure 21:
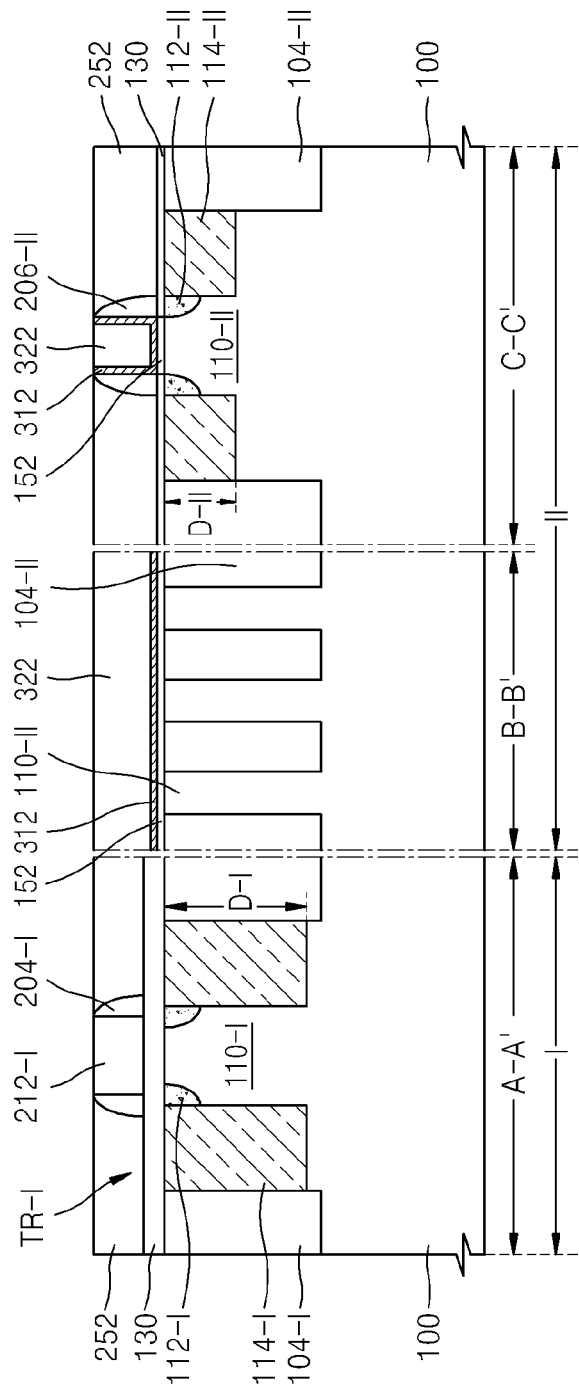

FIG. 21 is a cross-sectional view of a semiconductor device useful for explaining an exemplary embodiment of a method of forming a low voltage transistor TR-II according to another aspect of the inventive concept.

Referring to FIGS. 20 and 21, a second gate electrode 322 may be formed to fill the recess 302. Before the second gate electrode 322, a second gate insulating layer 312 may be formed to cover the surfaces exposed in the recess 302, including the exposed portion of the second active region 110-II and the exposed sides of second spacer layer 206-II. That is, the second gate insulating layer 312 may cover the surfaces exposed in the recess 302, and the second gate electrode 322 may be formed to fill a void within the second gate insulating layer 312. Thus, the second gate insulating layer 312 may extend from a space between the second active region 110-II and the second gate electrode 322 to a space between the second gate electrode 322 and the second spacer layer 206-II.

Thus, the low voltage transistor TR-II may be formed, including the second source/drain region 114-II that is disposed on both ends of the second active region 110-II, and the second gate insulating layer 312 and the second gate electrode 322 that are sequentially disposed on the second active region 110-II. The second gate insulating layer 312 may have a smaller thickness than that of the first gate insulating layer 130. That is, since the first gate insulating layer 130 is used as a gate insulating layer for the high voltage transistor TR-I, a thickness of the first gate insulating layer 130 may be greater than that of the second gate insulating layer 312 of the low voltage transistor TR-II.

The second gate electrode 320 may be formed of material having a lower resistivity than that of the first gate electrode 202-I. The second gate insulating layer 310 may be formed of material having a high dielectric constant.

An interfacial oxide layer 152 may be formed on the portion of the second active region 110-II that is exposed in the recess 302, i.e., between the spaced apart portions of second spacer layer 206-II. The interfacial oxide layer 152 may be formed only on the second active region 110-II exposed in the recess 302. When the interfacial oxide layer 152 is formed, the second gate insulating layer 312 and the second gate electrode 322 may be sequentially formed in the recess 302 in which the interfacial oxide layer 152 is formed.

Comparing the high voltage transistor TR-I and the low voltage transistor TR-II, the second source/drain region 114-II of the low voltage transistor TR-II may have a smaller thickness than that of the first source/drain region 114-I of the high voltage transistor TR-I.

A top surface of the first source/drain region 114-I, i.e., a top surface of the first active region 110-I, and a top surface of the second source/drain region 114-II, i.e., a top surface of the second active region 110-II may be at the same level. On the other hand, a bottom surface of the second source/drain region 114-II may be at a higher level than that of a bottom surface of the first source/drain region 114-I.

Both the high voltage transistor TR-I and the low voltage transistor TR-II are flat transistors, but an area of the low voltage transistor TR-II may be smaller than that of the high voltage transistor TR-I by using different materials for forming a gate insulating layer and a gate electrode.

Although not shown, the interfacial oxide layer 152 of FIG. 21 may be modified to have the same shape as that of the interfacial oxide layer 150a illustrated in FIG. 13B.

For reference, the first gate electrode G-I and the second gate electrode G-II of FIG. 1 may correspond to the first gate electrode 212-I and the second gate electrode 322 illustrated in FIGS. 15 through 21, respectively.

Figure 22:
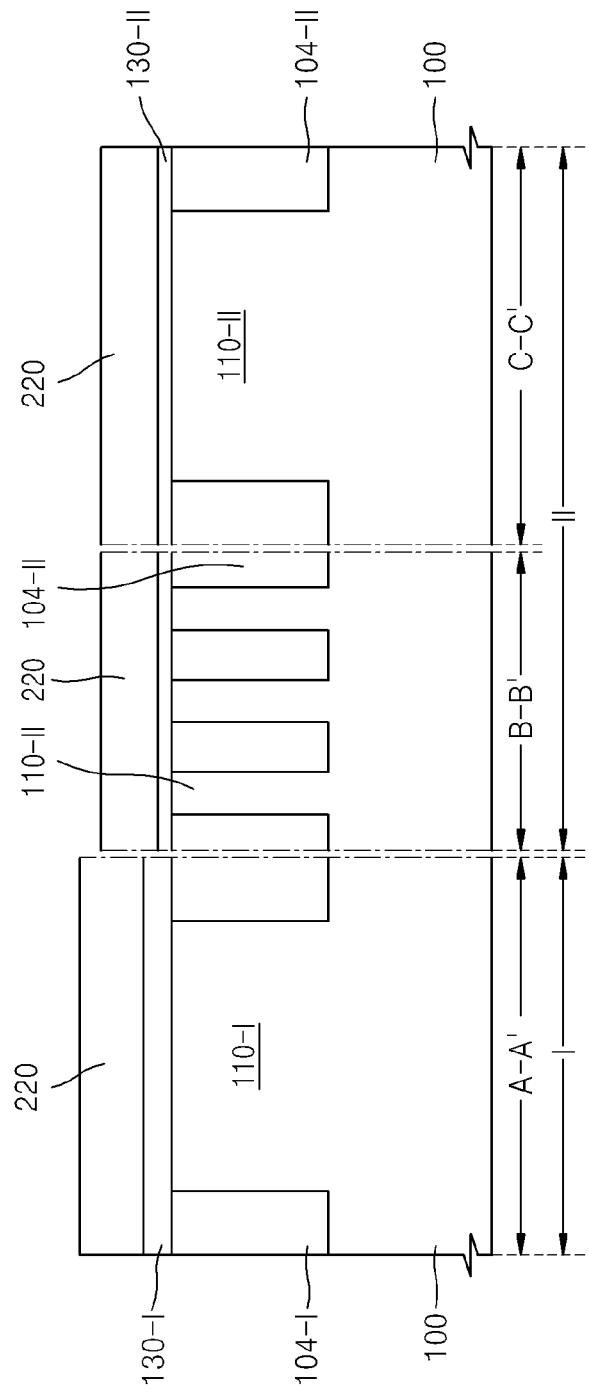
FIGS. 22 through 24 are cross-sectional views illustrating a semiconductor device useful for explaining an exemplary embodiment of a method of manufacturing a semiconductor device, according to another aspect of the inventive concept.
Figure 23:
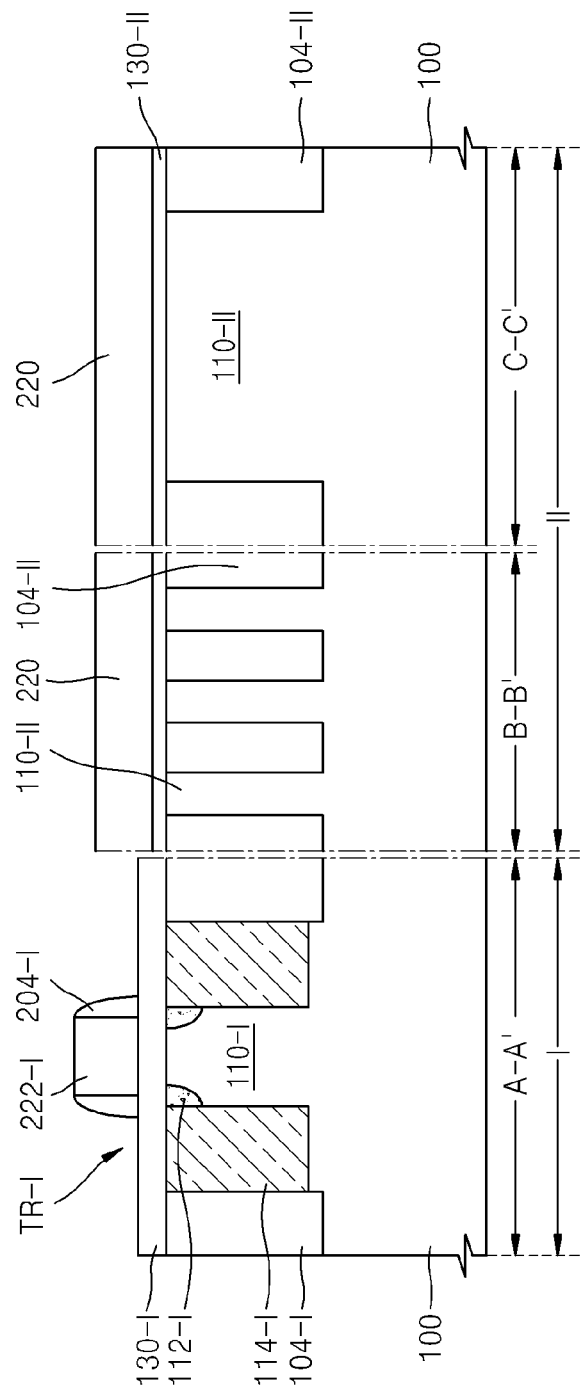
Figure 24:
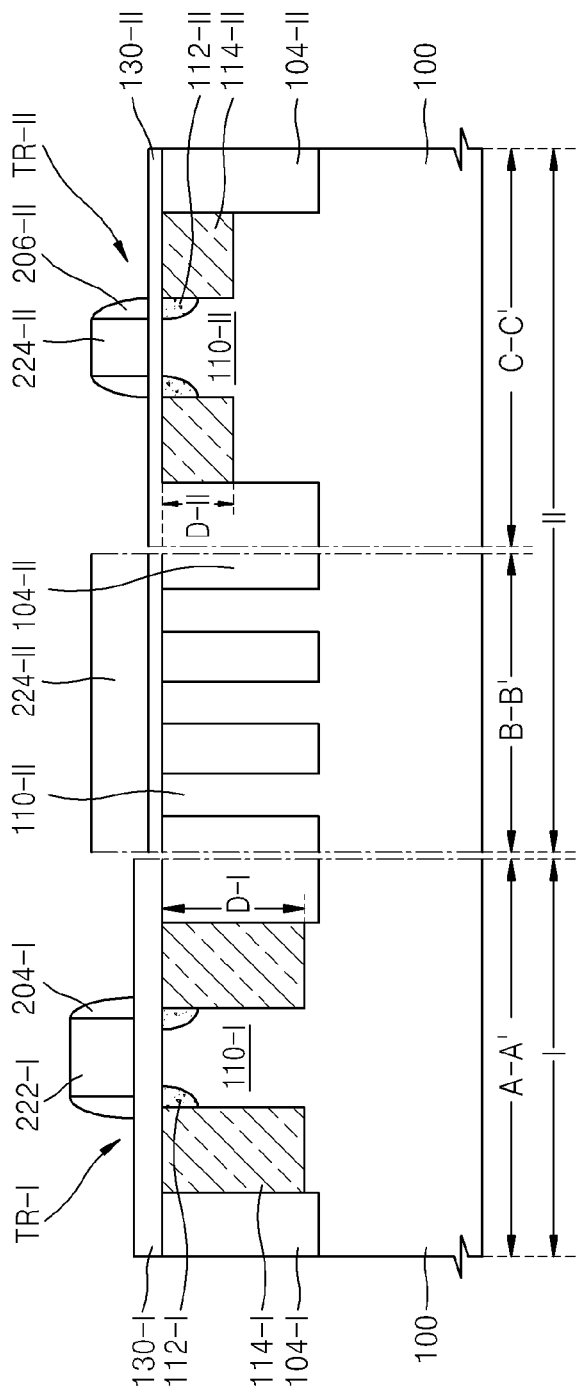

FIGS. 22 through 24 are cross-sectional views illustrating a method of manufacturing a semiconductor device, according to another aspect of the inventive concept. Descriptions that would be redundant with that of FIGS. 2 through 21 will be omitted.

FIG. 22 is a cross-sectional view of a semiconductor device useful for explaining an exemplary embodiment of a method of forming a gate material layer according to another aspect of the inventive concept. In detail, FIG. 22 is a cross-sectional view illustrating the device after the sacrificial layer 120 described with reference to FIG. 3 is removed.

Referring to FIG. 22, a first gate insulating layer 130-I and a second gate insulating layer 130-II may be formed to cover top surfaces of the first and second active regions 110-I and 110-II, respectively. The first gate insulating layer 130-I and the second gate insulating layer 130-II may have a thickness in a range of about 30 µm to about 200 µm, for example, and a thickness of the first gate insulating layer 130-I may be greater than that of the second gate insulating layer 130-II. For example, after a portion of the first gate insulating layer 130-I that has the same thickness as that of the second gate insulating layer 130-II is formed along with the second gate insulating layer 130-II, a portion of the first gate insulating layer 130-I that has a greater thickness than that of the second gate insulating layer 130-II may be additionally formed on the first active region 110-I. Alternatively, after an insulating layer having the same thickness as that of the first gate insulating layer 130-I is formed on the first and second active regions 110-I and 110-II, a portion of the second gate insulating layer 130-I is removed from the second active region 110-I so that the second gate insulating layer 130-I may have a smaller thickness than that of the first gate insulating layer 130-I.

Next, a gate material layer 220 is formed to cover the first and second gate insulating layers 130-I and 130-II. The gate material layer 220 may have the same thickness in the first and second regions I and II. In this regard, the gate material layer 220 may have a similar height difference to a height difference between the first and second gate insulating layers 130-I and 130-II.

FIG. 23 is a cross-sectional view of a semiconductor device useful for explaining an exemplary embodiment of a method of forming a high voltage transistor TR-I according to another aspect of the inventive concept.

Referring to FIGS. 22 and 23, a first gate electrode 222-I may be formed by patterning a portion of the gate material layer 220 formed in the first region I by using an etching process. In this regard, the portion of the gate material layer 200 in the second region II may remain.

Next, in order to form the high voltage transistor TR-I, a first source/drain region 114-I is formed in the first active region 110-I. Thus, the high voltage transistor TR-I including the first source/drain region 114-I that is disposed at both ends of the first active region 110-I, and the first gate insulating layer 130-I and the first gate electrode 222-I that are sequentially disposed on the first active region 110-I may be formed.

In order to form the high voltage transistor TR-I, a first spacer layer 204-I and a first LDD region 112-I as well as the first source/drain region 114-I may be further formed.

FIG. 24 is a cross-sectional view of a semiconductor device useful for explaining an exemplary embodiment of a method of forming a low voltage transistor TR-II according to another aspect of the inventive concept.

Referring to FIGS. 23 and 24, the low voltage transistor TR-II may be formed using a similar method to the method of forming the high voltage transistor TR-I.

A second gate electrode 224-II is formed by patterning a portion of the gate material layer 220 of the second region II by using an etching process. Next, in order to form the low voltage transistor TR-II, a second source/drain region 114a-II is formed in the second active region 110-II. Thus, the low voltage transistor TR-II including the second source/drain region 114a-II that is disposed at both ends of the second active region 110-II, and the second gate insulating layer 130-II and the second gate electrode 222-II that are sequentially disposed on the second active region 110-II may be formed.

In order to form the low voltage transistor TR-I, a second spacer layer 206-II and a second LDD region 112-II as well as the second source/drain region 114-II may be further formed.

Comparing the high voltage transistor TR-I and the low voltage transistor TR-II, the second source/drain region 114-II of the low voltage transistor TR-II may have a thickness that is less than that of the first source/drain region 114-I of the high voltage transistor TR-I.

A top surface of the first source/drain region 114-I, a top surface of the first active region 110I, a top surface of the second source/drain region 114-II, and a top surface of the second active region 110-II may be at the same level. Additionally, a bottom surface of the second source/drain region 114-II may be at a higher level than a bottom surface of the first source/drain region 114I.

Both the high voltage transistor TR-I and the low voltage transistor TR-II are flat transistors, and materials for forming a gate insulating layer and a gate electrode are the same. However, since an operating voltage of the low voltage transistor TR-II is lower than an operating voltage of the high voltage transistor TR-I, an area of the low voltage transistor TR-II may be smaller than that of the high voltage transistor TR-I by using gate insulating layers having different thicknesses.

Figure 25:
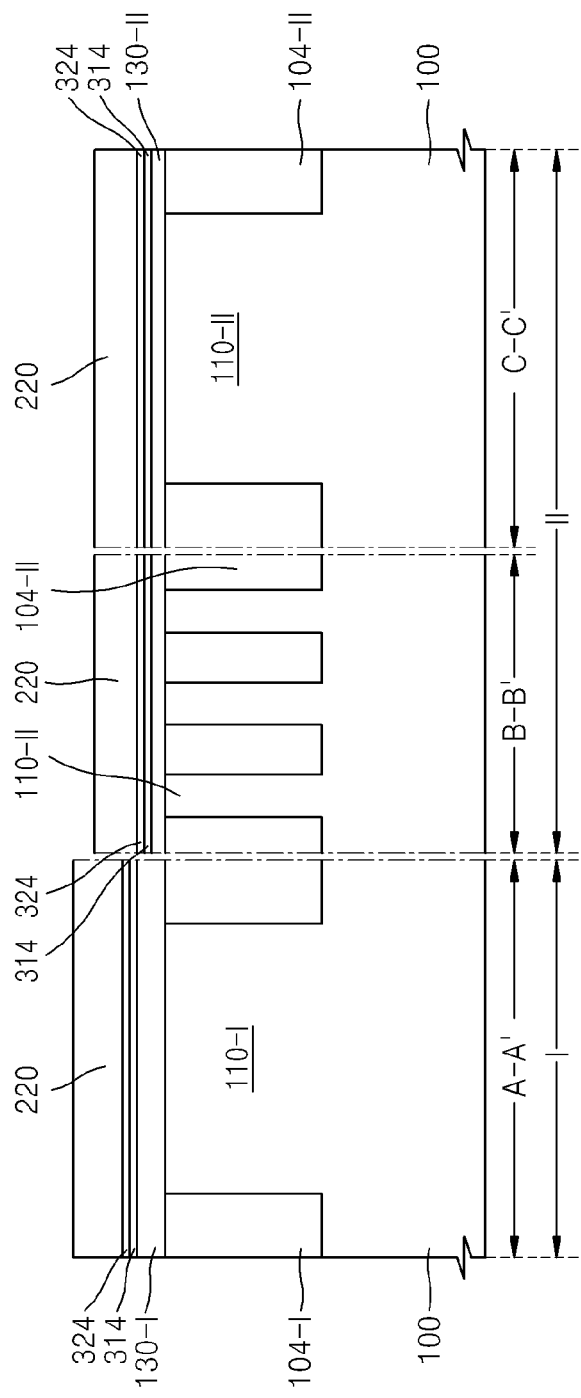
FIGS. 25 and 26 are cross-sectional views illustrating a semiconductor device useful for explaining an exemplary embodiment of a method of manufacturing a semiconductor device, as a modification of the method illustrated in FIGS. 22 through 24.
Figure 26:
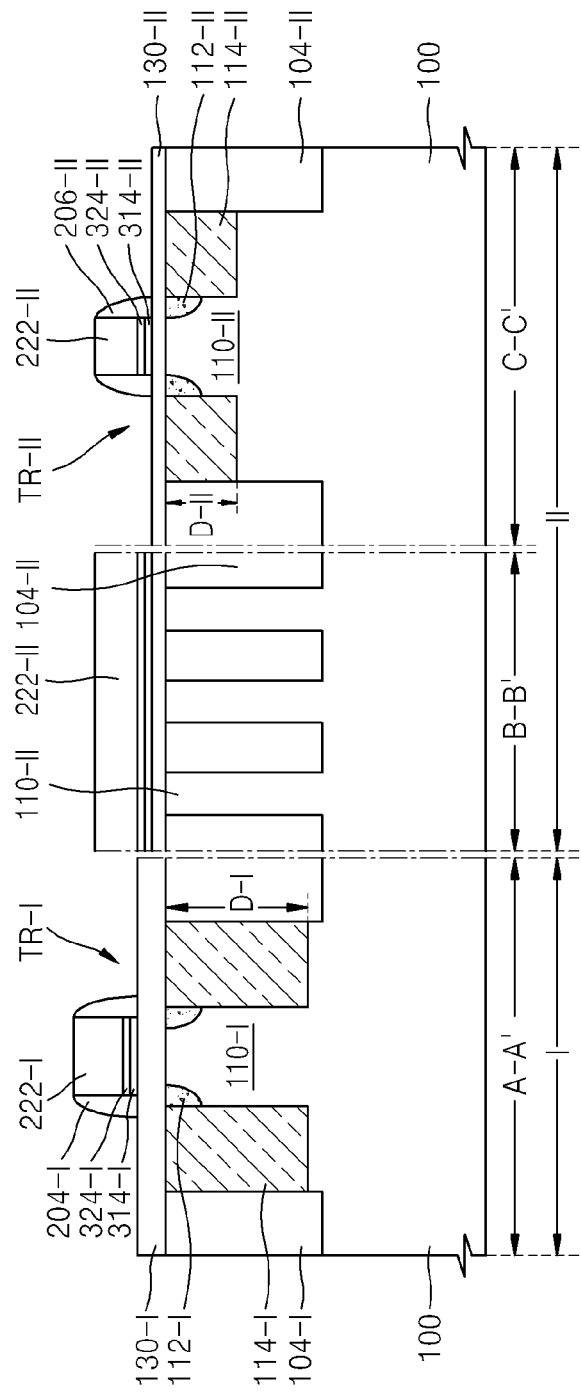

FIGS. 25 and 26 are cross-sectional views illustrating a method of manufacturing a semiconductor device, according to a modification of the method illustrated using FIGS. 22 through 24. Descriptions that would be redundant with that of FIGS. 2 through 24 will be omitted.

FIG. 25 is a cross-sectional view of a semiconductor device useful for explaining an exemplary embodiment of a method of forming a gate material layer according to a modification of the method illustrated in FIGS. 22 through 24. FIG. 22 is a cross-sectional view of the device after the sacrificial layer 120 of FIG. 3 is removed.

Comparing FIG. 25 with FIG. 22, a high dielectric gate insulating layer 314 and a low resistivity gate material layer 324 may be further formed between the first gate insulating layer 130-I and the gate material layer 220 and between the second gate insulating layer 130-II and the gate material layer 220, respectively.

The high dielectric gate insulating layer 314 and the low resistivity gate material layer 324 may be formed of materials having the same or similar characteristics as those of the second gate insulating layer 310 and the second gate electrode 320 illustrated in FIG. 13A.

FIG. 26 is a cross-sectional view of a semiconductor device useful for explaining an exemplary embodiment of a method of forming a high voltage transistor and a low voltage transistor according to a modification of the method illustrated in FIGS. 22 through 24.

Comparing FIG. 26 with FIG. 23, when the first gate electrode 222-I is formed by patterning the gate material layer 220 in the first region I, a first high dielectric gate insulating layer 314-I and a first low resistivity gate material layer 324-I are formed by the high dielectric gate insulating layer 314 and the low resistivity gate material layer 324 in the first region I. Next, by forming a first source/drain region 1144 in the first active region 110-I, the high voltage transistor TR-I, including the first source/drain region 114-I that is disposed at both ends of the first active region 1104, and a first gate insulating layer 1304, the first high dielectric gate insulating layer 314-I, the first low resistivity gate material layer 324-I, and the high gate electrode 222-I that are sequentially disposed on the first active region 110-I may be formed.

Comparing FIG. 26 with FIG. 24, when the second gate electrode 222-II is formed by patterning the gate material layer 220 in the second region II, a second high dielectric gate insulating layer 314-II and a second low resistivity gate material layer 324-II are formed by the high dielectric gate insulating layer 314 and the low resistivity gate material layer 324 in the second region II. Next, a second spacer layer 206-II and a first LDD region 112-II, as well as the second source/drain region 114-II, may be further formed.

Although both the high voltage transistor TR-I and the low voltage transistor TR-II are flat transistors, portions of the high dielectric gate insulating layer and the low resistivity gate material layer may be further included in the gate insulating layer and the gate electrode so that dielectric characteristics of the gate insulating layer and conductivity of the gate electrode may be improved.

Figure 27:
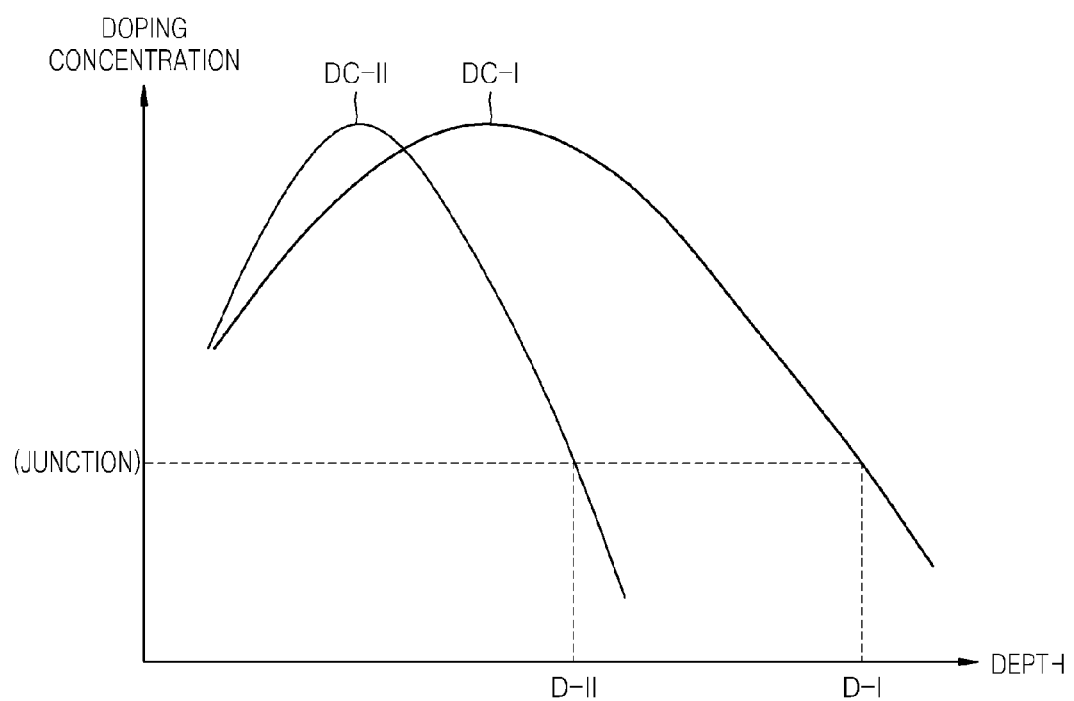
FIG. 27 is a graph showing an exemplary embodiment of a doping concentration of a first source/drain region and a second source/drain region according to a doping depth, according to aspects of the inventive concept.

FIG. 27 is a graph showing doping concentration of a first source/drain region and a second source/drain region according to a doping depth, according to exemplary embodiments of the inventive concept.

Referring to FIG. 27, doping concentration DC-I of a first source/drain region of a high voltage transistor and doping concentration DC-II of a first source/drain region of a low voltage transistor are illustrated according to depths. The high voltage transistor may correspond to the high voltage transistor TR-I illustrated in FIGS. 13A, 13B, 21, 24, and 26, and the low voltage transistor may correspond to the low voltage transistor TR-II illustrated in FIGS. 13A, 13B, 21, 24, and 26. In addition, the first source/drain region may correspond to the first source/drain region 114-I illustrated in FIGS. 13A, 13B, 21, 24, and 26, and the second source/drain region may correspond to the second source/drain region 114-II or 114a-II illustrated in FIGS. 13A, 13B, 21, 24, and 26.

Thus, a thickness D-I of the first source/drain region 114-I of the high voltage transistor TR-I may be greater than a thickness D-II of the second source/drain region 114-II or 114-IIa of the low voltage transistor TR-II. In addition, the doping concentration DC-II of the second source/drain region 114-II or 114-IIa of the low voltage transistor TR-II may vary more than the doping concentration DC-I of the first source/drain region 114-I of the high voltage transistor TR-I according to their depths.

Figure 28:
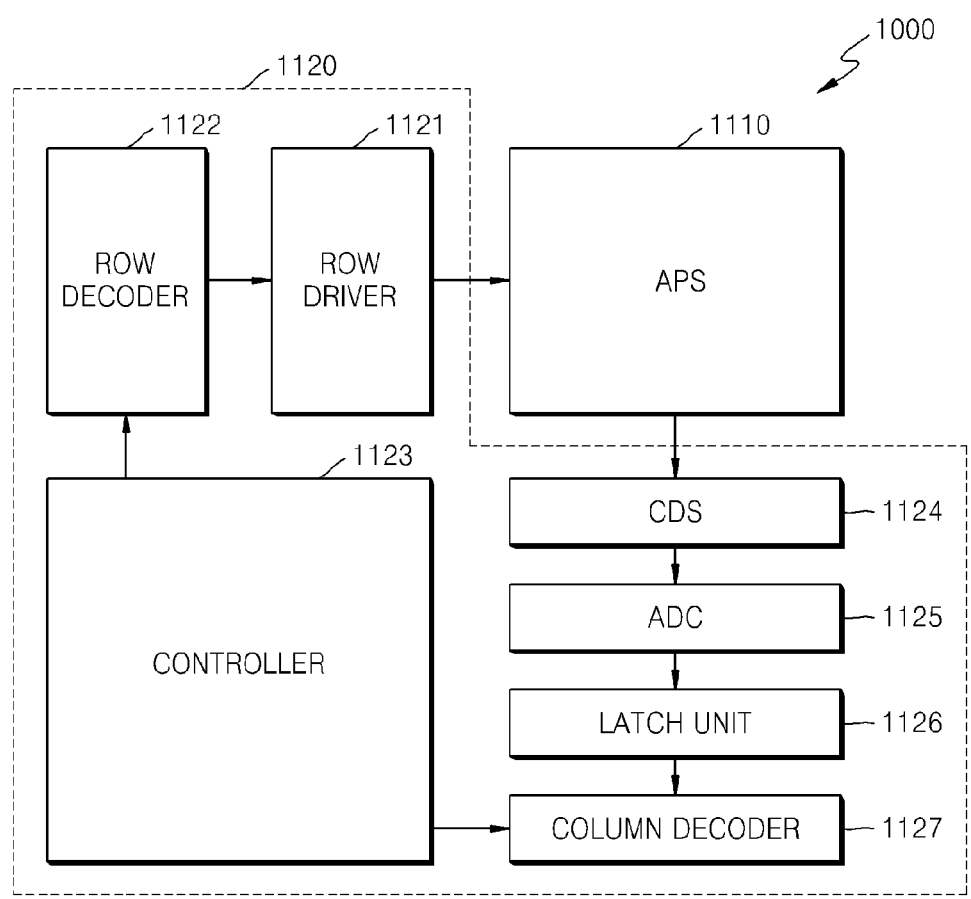
FIG. 28 is a schematic block diagram of an exemplary embodiment of an image sensor including a semiconductor device, according to an aspect of the inventive concept.

FIG. 28 is a schematic block diagram an exemplary embodiment of an image sensor 1000 including a semiconductor device, according to an aspect of the inventive concept.

Referring to FIG. 28, the image sensor 1000 according to the current embodiment may include an active pixel sensor (APS) array region 1110 in which pixels each including a light receiving element (not shown) are arranged in a two-dimensional (2D) manner, and a control circuit region 1120 for operating the APS array region 1110.

Figure 29:
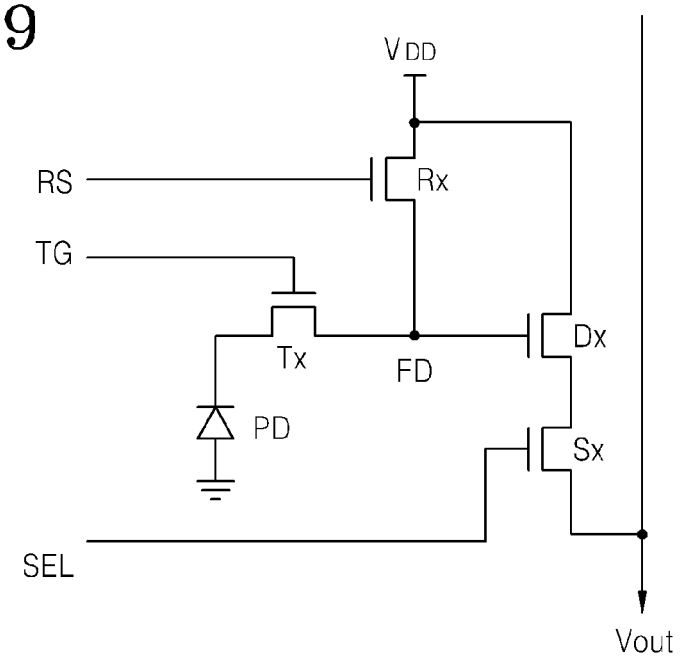
FIG. 29 is a circuit diagram of an exemplary embodiment of unit pixels included in the image sensor illustrated in FIG. 28.

The APS array region 1110 includes a plurality of pixels that are arranged in a 2D manner, and a light receiving element (not shown) is disposed in each pixel. The APS array region 1110 is formed when unit pixels are arranged in a matrix form, like in an equivalent circuit diagram illustrated in FIG. 29. The APS array region 1110 is driven by converting a light signal into an electrical signal and by receiving a plurality of driving signals, such as a pixel selection signal SEL, a reset signal RS, a transmission signal TG, and the like, from a row driver 1121, as illustrated in FIGS. 28 and 29. In addition, the converted electrical signal is supplied to a correlated double sampler (CDS) 1124 via a vertical signal line (Vout of FIG. 29).

In this embodiment, the control circuit region 1120 may include a controller 1123, a row decoder 1122, the row driver 1121, the CDS 1124, an analog-digital converter (ADC) 1125, a latch unit 1126, and a column decoder 1127.

The controller 1123 supplies a control signal to the row decoder 1122 and the column decoder 1127. The row driver 1121 supplies a plurality of driving signals for driving the plurality of pixels to the APS array region 1110 based on a result of decoding performed by the row decoder 1122. When pixels are generally arranged in a matrix form, the row driver 1121 supplies driving signals in each row.

The CDS 1124 receives an electrical signal formed in the APS array region 1110 via the vertical signal line (Vout of FIG. 29) and samples and holds the electrical signal. That is, the CDS 1124 double samples a particular noise level and a level of the generated electrical signal, thereby outputting a difference level that corresponds to a difference between the noise level and the signal level.

The ADC 1125 outputs an analog signal corresponding to the difference level as a digital signal.

The latch unit 1126 latches the digital signal, and the latched signal is sequentially output to an image signal processor (not shown) based on a result of decoding performed by the column decoder 1127.

As mentioned above, the high voltage transistor TR-I illustrated in FIGS. 13A, 13B, 21, 24, and 26 may correspond to a transistor formed in the APS array region 1110. And the low voltage transistor TR-II illustrated in FIGS. 13A, 13B, 21, 24, and 26 may correspond to a transistor formed in the control circuit region 1120. Alternatively, the high voltage transistor TR-I illustrated in FIGS. 13A, 13B, 21, 24, and 26 may correspond to a transistor for an analog logic circuit formed in the control circuit region1 1120.

Thus, by forming the low voltage transistor TR-II having a relatively small area in the control circuit region 1120, the APS array region 1110 may accordingly have a reduced area.

FIG. 29 is an embodiment of a circuit diagram of an example of unit pixels that can be included in the image sensor 1000 illustrated in FIG. 28. In detail, FIG. 29 illustrates an equivalent circuit diagram of unit pixels including one photodiode and four transistors.

Referring to FIG. 29, the unit pixels may include a photodiode PD, a transfer transistor Tx, a reset transistor Rx, a driver transistor Dx, and a select transistor Sx.

The photodiode PD generates light charges by receiving light, and the transfer transistor Tx transfers the light charges generated in the photodiode PD to a floating diffusion region FD.

In addition, the reset transistor Rx resets the charges stored in the floating diffusion region FD periodically. The drive transistor Dx servers as a source follower buffer amplifier that is configured to buffer signals generated by the charges stored in the floating diffusion region FD. The select transistor Sx performs switching and addressing for selecting unit pixels. Here, "RS" is a signal applied to a gate of the reset transistor Rx, and "TG" is a signal applied to a gate of the transfer transistor Tx. In addition, "SEL" is a signal applied to a gate of the select transistor Sx.

A power supply terminal VDD is connected to a source of the reset transistor Rx. When a reset voltage RS is applied to the gate of the reset transistor Rx, the reset transistor Rx is turned on, and a potential of the floating diffusion region FD is charged by a VDD voltage at a source of the reset transistor Rx. As a result, the floating diffusion region FD is reset to a predetermined voltage VDD-Vth (where Vth is a threshold voltage of the reset transistor Rx).

The charges stored in the floating diffusion region FD are applied to the gate of the drive transistor Dx and are used in controlling current that flows through the select transistor Sx, which is turned on in response to the selection signal SEL applied to the gate of the select transistor Sx. The current that flows through the select transistor Sx is output as an output signal of the unit pixels at an output terminal Vout of the unit pixels. The output signal is read by a load transistor (not shown) that is connected to the output terminal Vout of the unit pixels.

The high voltage transistor TR-I illustrated in FIGS. 13A, 13B, 21, 24, and 26 may correspond to one or more of the transfer transistor Tx, the reset transistor Rx, the drive transistor Dx, and the select transistor Sx.

Figure 30:
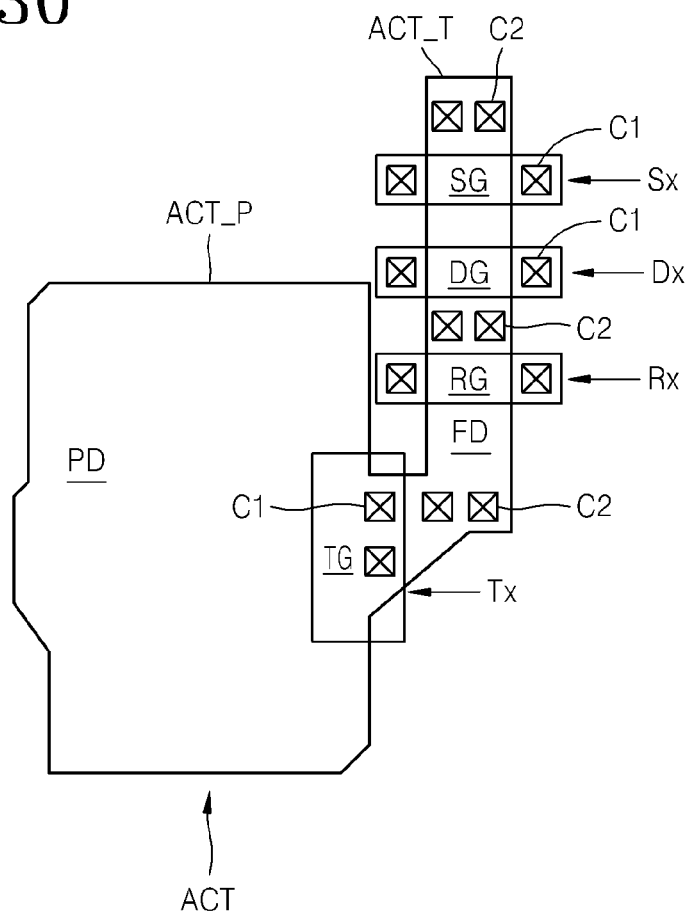
FIG. 30 is an exemplary embodiment of a schematic layout diagram of the image sensor illustrated in FIG. 28.

FIG. 30 is a schematic layout diagram of an embodiment of the image sensor illustrated in FIG. 28. FIG. 30 provides a configuration corresponding to the equivalent circuit diagram of FIG. 29.

Referring to FIG. 30, unit pixels include active regions ACT that are defined by a predetermined shape in a pixel array region of a semiconductor substrate. Each of the active regions ACT are divided into a photodiode region ACT_P in which the photodiode PD is formed, and a transistor region ACT_T in which a transistor is formed. The photodiode region ACT_P that is a light receiving region among the active regions ACT, may be formed in a predetermined shape for occupying a predetermined region of the semiconductor substrate in the unit pixels, for example, a rectangular shape in view of a plane. The transistor region ACT_T may be formed in a line shape in which the transistor region ACT_T contacts a portion of the photodiode region ACT_P and at least one portion of the transistor region ACT_T is cut.

A gate TG of the transfer transistor Tx is disposed at a boundary between the photodiode region ACT_P and the transistor region ACT_T among the active regions ACT. A gate RG of the reset transistor Rx, a gate DG of the drive transistor Dx, and a gate SG of the select transistor Sx are disposed on the transistor region ACT_T of the active region ACT by a predetermined distance therebetween. The order of arrangement of transistors illustrated in FIG. 30 is just an example and may vary if necessary.

The high voltage transistor TR-I illustrated in FIGS. 13A, 13B, 21, 24, and 26 may correspond to one or more of the transfer transistor Tx, the reset transistor Rx, the drive transistor Dx, and the select transistor Sx illustrated in FIG. 30.

A first contact plug C1 and a second contact plug C2 refer to contact plugs formed on the gates RG, SG, DG, and TG and the active region ACT. In the current embodiment, in the first contact plug C1 formed on the gates RG, SG, DG, and TG and the second contact plug C2 formed on the active region ACT including a source/drain region, two contact plugs may form a pair.

While the foregoing has described what are considered to be the best mode and/or other preferred embodiments, it is understood that various modifications can be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A semiconductor device comprising:
a semiconductor substrate comprising a high voltage region and a low voltage region;
a high voltage transistor formed in the high voltage region and comprising a first active region, a first source/drain region, a first gate insulating layer, and a first gate electrode; and
a low voltage transistor formed in the low voltage region and comprising a second active region, a second source/drain region, a second gate insulating layer, and a second gate electrode, a pair of second spacer layers disposed at both sides of the second gate electrode, wherein the second gate insulating layer extends from a space between the second gate electrode and the second active region to a space between the second gate electrode and the second spacer layer, and an interfacial oxide layer is formed between the second gate insulating layer and the pair of second spacer layer,
wherein the second source/drain region has a smaller thickness than a thickness of the first source/drain region, and
wherein a width of the first active region in a direction in which the first gate electrode extends, is greater than a width of the second active region in a direction in which the second gate electrode extends.

2. The semiconductor device of claim 1, wherein a bottom surface of the second source/drain region is at a higher level than a bottom surface of the first source/drain region.

3. The semiconductor device of claim 1, wherein the first gate insulating layer is thicker than the second gate insulating layer.

4. The semiconductor device of claim 1, wherein the second gate electrode comprises material having a lower resistivity than resistivity of the first gate electrode.

5. The semiconductor device of claim 1, wherein the second gate electrode comprises metal or conductive metal nitride.

6. The semiconductor device of claim 1, wherein the low voltage transistor comprises a Fin field effect transistor (FinFET) in which a channel region is formed on a top surface and both sides of the second active region.

7. The semiconductor device of claim 1, wherein in the second source/drain region a slope of a doping concentration curve versus depth is greater than that in the first source/drain region.

8. The semiconductor device of claim 1, wherein the second gate insulating layer comprises material having a higher dielectric constant than a dielectric constant of the first gate insulating layer.

9. The semiconductor device of claim 8, wherein the first gate insulating layer comprises silicon oxide or silicon oxynitride, and the second gate insulating layer has a high dielectric constant than the first gate insulating layer and the second gate insulating layer comprises metal oxide or metal silicate.

10. The semiconductor device of claim 8, further comprising an interfacial oxide layer disposed between the second gate insulating layer and the second active region.

11. The semiconductor device of claim 1, further comprising a first isolation layer and a second isolation layer that define the first active region and the second active region, respectively, wherein a bottom surface of the first isolation layer and a bottom surface of the second isolation layer are at the same level.

12. The semiconductor device of claim 11, wherein a bottom surface of the first gate electrode is at a higher level from the semiconductor substrate than a bottom surface of the second gate electrode.

13. A semiconductor device comprising:
- a semiconductor substrate comprising a high voltage region and a low voltage region;
- a high voltage transistor formed in the high voltage region, the high voltage transistor including a first active region that comprises the first source/drain region, a first gate insulating layer, and a first gate electrode; and
- a low voltage transistor formed in the low voltage region, the low voltage transistor comprising a second active region, a second source/drain region, a second gate insulating layer, and a second gate electrode, a pair of second spacer layers disposed at both sides of the second gate electrode, wherein the second gate insulating layer extends from a space between the second gate electrode and the second active region to a space between the second gate electrode and the second spacer layer, and an interfacial oxide layer formed between the second gate insulating layer and the pair of second spacer layer, the low voltage transistor including a second active region that comprises the second source/drain region, the second gate insulating layer, and the second gate electrode, wherein the high voltage transistor has a first source/drain region that is thicker than the second source/drain region of the low voltage transistor, and wherein a width of the first active region in a direction in which the first gate electrode extends is greater than a width of the second active region in a direction in which the second gate electrode extends.

14. The semiconductor device of claim 13, wherein a top surface of the first gate electrode and a top surface of the second gate electrode are at the same level.

15. The semiconductor device of claim 13, wherein the first gate insulating layer is thicker than the second gate insulating layer.

* * * * *